United States Patent
Zheng et al.

(10) Patent No.: US 12,274,015 B2
(45) Date of Patent: Apr. 8, 2025

(54) ELECTRONIC ASSEMBLY AND ELECTRONIC DEVICE

(71) Applicant: GUANGDONG OPPO MOBILE TELECOMMUNICATIONS CORP., LTD., Guangdong (CN)

(72) Inventors: Zekuan Zheng, Guangdong (CN); Jie Li, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 91 days.

(21) Appl. No.: 17/817,460

(22) Filed: Aug. 4, 2022

(65) Prior Publication Data

US 2022/0377920 A1 Nov. 24, 2022

Related U.S. Application Data

(63) Continuation of application No. PCT/CN2021/078897, filed on Mar. 3, 2021.

(30) Foreign Application Priority Data

Apr. 30, 2020 (CN) .......................... 202010371220.0

(51) Int. Cl.
*H05K 5/02* (2006.01)
*G06F 1/16* (2006.01)

(52) U.S. Cl.
CPC ......... *H05K 5/0226* (2013.01); *G06F 1/1681* (2013.01); *E05Y 2999/00* (2024.05)

(58) Field of Classification Search
CPC ... H05K 5/0226; G06F 1/1681; G06F 1/1652; E05Y 2900/606; E05D 3/122;
(Continued)

(56) References Cited

U.S. PATENT DOCUMENTS 10,036,188 B1 * 7/2018 Yao ...................... G06F 1/1681
10,423,019 B1 * 9/2019 Song ..................... G06F 1/1641
(Continued)

FOREIGN PATENT DOCUMENTS

CN 107731100 2/2018
CN 108322567 7/2018
(Continued)

OTHER PUBLICATIONS

EPO, Extended European Search Report for EP Application No. 21795586.3, Jun. 29, 2023.
(Continued)

*Primary Examiner* — Anthony M Haughton
*Assistant Examiner* — Theron S Milliser
(74) *Attorney, Agent, or Firm* — Hodgson Russ LLP

(57) ABSTRACT

An electronic assembly includes a shaft assembly and housings arranged oppositely. The shaft assembly includes a first shaft case, first rotating members, and rotating units. The first rotating members are at least partially disposed at two opposite sides of the first shaft case. Each of the first rotating members has one end rotatably connected with the first shaft case and the other end connected with the housings. The rotating units are at least partially disposed at the two opposite sides of the first shaft case. Each of the rotating units includes a second rotating member and a movable plate. The second rotating member has one end rotatably connected with the first shaft case and the other end connected with the movable plate. The movable plate has one end connected to the housings.

19 Claims, 20 Drawing Sheets

(58) Field of Classification Search
CPC .. H04M 1/022; H04M 1/0268; H04M 1/0214; H04M 1/0216; F16C 11/10; F16C 2370/00; F16C 2380/00; F16C 11/04; G09F 9/301
See application file for complete search history.

(56) References Cited

U.S. PATENT DOCUMENTS

| | | | | |
|---|---|---|---|---|
| 10,480,225 | B1 | 11/2019 | Hsu et al. | |
| 10,761,574 | B1* | 9/2020 | Hsu | G06F 1/1626 |
| 11,467,633 | B2* | 10/2022 | Liao | H04M 1/0268 |
| 11,627,671 | B2* | 4/2023 | Feng | H04M 1/0268 361/807 |
| 11,659,073 | B1* | 5/2023 | Hsu | H04M 1/022 16/221 |
| 11,832,405 | B2* | 11/2023 | Zhang | H05K 5/0226 |
| 2020/0021674 | A1 | 1/2020 | Cheng | |
| 2021/0181808 | A1* | 6/2021 | Liao | G06F 1/1641 |
| 2022/0159845 | A1* | 5/2022 | Feng | G06F 1/1616 |
| 2022/0345558 | A1* | 10/2022 | Liu | G06F 1/16 |
| 2022/0377919 | A1* | 11/2022 | Zhang | H05K 5/0226 |
| 2023/0049603 | A1* | 2/2023 | Zheng | H04M 1/0216 |
| 2023/0053947 | A1* | 2/2023 | Liu | G06F 1/1652 |
| 2023/0054923 | A1* | 2/2023 | Liao | G06F 1/1641 |
| 2023/0132825 | A1* | 5/2023 | Hsu | H04M 1/0216 16/221 |
| 2023/0195181 | A1* | 6/2023 | Zheng | G06F 1/1681 361/679.27 |

FOREIGN PATENT DOCUMENTS

| | | |
|---|---|---|
| CN | 207777905 | 8/2018 |
| CN | 109270987 | 1/2019 |
| CN | 208421694 | 1/2019 |
| CN | 208421695 | 1/2019 |
| CN | 109379517 | 2/2019 |
| CN | 208651418 | 3/2019 |
| CN | 208656822 | 3/2019 |
| CN | 109780403 | 5/2019 |
| CN | 110030255 | 7/2019 |
| CN | 110273916 | 9/2019 |
| CN | 209545628 | 10/2019 |
| CN | 209591356 | 11/2019 |
| CN | 110611726 | 12/2019 |
| CN | 110714976 | 1/2020 |
| CN | 110714978 | 1/2020 |
| CN | 110778598 | 2/2020 |
| CN | 110784570 | 2/2020 |
| CN | 110995892 | 4/2020 |
| CN | 113586594 | 6/2022 |
| JP | 2002359674 | 12/2002 |
| JP | 2013118437 | 6/2013 |
| JP | 2019211778 | 12/2019 |
| KR | 20160027625 | 3/2016 |
| KR | 20160121350 | 10/2016 |
| KR | 20170136907 | 12/2017 |
| KR | 20190062107 | 6/2019 |
| TW | 201921219 | 6/2019 |
| WO | 2020022758 | 1/2020 |

OTHER PUBLICATIONS

KIPO, Office Action for KR Application No. 10-2022-7032644, Aug. 14, 2023.
CNIPA, First Office Action for CN Application No. 202210518117.3, Dec. 19, 2022.
JPO, Office Action for JP Application No. 2022-553628, Sep. 26, 2023.
CNIPA, First Office Action for CN Application No. 202210518540.3, Oct. 29, 2023.
CNIPA, First Office Action for CN Application No. 202010371220.0, Mar. 9, 2022.
WIPO, International Search Report and Written Opinion for International Application No. PCT/CN2021/078897, Apr. 28, 2021.
KIPO, Office Action for KR Application No. 10-2022-7032644, Feb. 26, 2024.
IPI, Office Action for IN Application No. 202217048722, Oct. 29, 2024.

* cited by examiner

US 12,274,015 B2

ELECTRONIC ASSEMBLY AND ELECTRONIC DEVICE

CROSS-REFERENCE TO RELATED APPLICATIONS

This application is a continuation of International Application No. PCT/CN2021/078897, filed Mar. 3, 2021, which claims priority to Chinese Patent Application No. 202010371220.0, filed Apr. 30, 2020, the entire disclosures of which are incorporated herein by reference.

TECHNICAL FIELD

This application relates to the technical field of electronic products, and in particular, to an electronic assembly and an electronic device.

BACKGROUND

With the continuous development of electronic products, the electronic product is now favored by users due to its portability and a variety of operability. However, at the same time, the users' expectations and requirements for the electronic products are also getting higher and higher. For example, in flexible electronic devices, a shaft assembly is one of important structural components to control folding/unfolding of the electronic device. However, a current shaft assembly is relatively complex in structure, which increases total gaps, thus displacements after falling is enlarged, and a quality of the shaft assembly is declined.

SUMMARY

In view of above, in a first aspect of the disclosure, an electronic assembly is provided. The electronic assembly includes a shaft assembly and housings arranged oppositely. The shaft assembly includes a first shaft case, first rotating members, and rotating units. The housings are at least partially disposed at two opposite sides of the first shaft case. The first rotating members are at least partially disposed at the two opposite sides of the first shaft case. Each of the first rotating members has one end rotatably connected with the first shaft case and the other end connected with the housings. The rotating units are at least partially disposed at the two opposite sides of the first shaft case. Each of the rotating units includes a second rotating member and a movable plate. The second rotating member has one end rotatably connected with the first shaft case and the other end connected with the movable plate. The movable plate has one end connected to the housings.

In a second aspect of the disclosure, an electronic device is provided. The electronic device includes a flexible screen and the electronic assembly provided in the first aspect of the disclosure. The flexible screen is mounted on the movable plate of the electronic assembly.

BRIEF DESCRIPTION OF THE DRAWINGS

In order to describe technical solutions in implementations of the disclosure more clearly, the following will give a brief introduction to the accompanying drawings used for describing the implementations.

Figure 1:
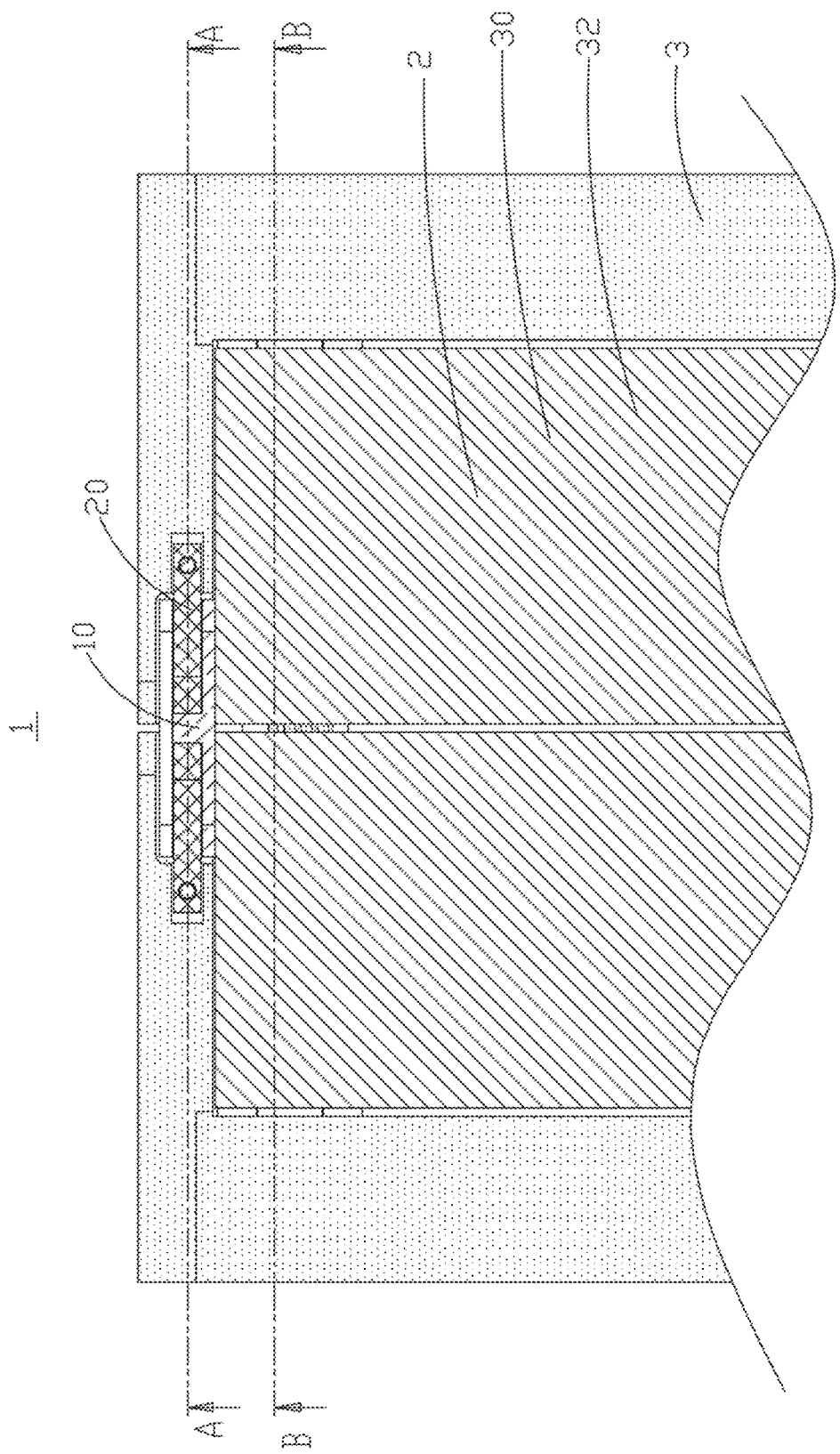
FIG. 1 is a partial top view of an electronic assembly in an implementation of the disclosure.

REFERENCE SIGNS electronic assembly—1, shaft assembly—2, housing—3, electronic device—4, flexible screen—5, first shaft case—10, first sidewall—11, second sidewall—12, first positioning portion—13, second positioning portion—14, third rotating portion—15, fourth rotating portion—16, baffle plate—17, third receiving space—18, first rotating member—20, rotary hole—200, rotary shaft—300, first sub-rotating member—21, second sub-rotating member—22, teeth—23, rotating unit—30, second rotating member—31, movable plate—32, first sliding portion—33, second sliding portion—34, first rotating portion—35, second rotating portion—36, rotating hole—37, rotating member—38, second shaft case—40, synchronization mechanism—50, first gear—51, second gear—52, first bracket—60, first receiving space—61, first internal gear—62, first accommodating space—63, second bracket—70, second receiving space—71, second internal gear—72, second accommodating space—73, first spur gear—80, first sub-spur gear—81, second sub-spur gear—82, second spur gear—83, third sub-spur gear—84, fourth sub-spur gear—85, damping mechanism—90, first limiting portion—91, first flat surface—911, first protruding portion—912, first inclined surface—913, third flat surface—914, second limiting portion—92, third limiting portion—93, second flat surface—931, second protruding portion—932, second inclined surface—933, fourth flat surface—934, elastic member—94, avoidance groove—95.

DETAILED DESCRIPTION

The above description are preferred implementations of the disclosure, and it is noted that various improvements and modifications can be made without departing from the principle of the application to those of ordinary skill in the art, and the improvement and the modification are also considered as the protection scope of the disclosure.

An electronic assembly is provided in the disclosure. The electronic assembly includes a shaft assembly and housings arranged oppositely. The shaft assembly includes a first shaft case, first rotating members, and rotating units. The housings are at least partially disposed at two opposite sides of the first shaft case. The first rotating members are at least partially disposed at the two opposite sides of the first shaft case. Each of the first rotating members has one end rotatably connected with the first shaft case and the other end connected with the housings. The rotating units are at least partially disposed at the two opposite sides of the first shaft case. Each of the rotating units includes a second rotating member and a movable plate. The second rotating member has one end rotatably connected with the first shaft case and the other end connected with the movable plate. The movable plate has one end connected to the housings.

In an implementation, the first shaft case has first sidewalls arranged oppositely and second sidewalls arranged oppositely. Each of the second sidewalls is connected with the first sidewalls arranged oppositely. The first rotating member is rotatably connected to the first sidewall. The second rotating member is rotatably connected to the second sidewall.

In an implementation, an orthographic projection of a rotation center of the second rotating member on the first sidewall is spaced apart from a rotation center of the first rotating member.

In an implementation, the movable plate has a first sliding portion. The second rotating member has a second sliding portion. The first sliding portion and the second sliding portion cooperate with each other to allow the movable plate to slide relative to the second rotating member.

In an implementation, the movable plate has a first rotating portion at one end thereof. The housing has a second rotating portion. The first rotating portion and the second rotating portion cooperate with each other to allow the movable plate to be rotatably connected with the housing at one end of the movable plate.

In an implementation, the first rotating portion defines a rotating hole. The second rotating portion has a rotating member. The first rotating portion is sleeved with the rotating member through the rotating hole to allow the movable plate to be rotatably connected with the housing at one end of the movable plate.

In an implementation, the electronic assembly further includes second shaft cases connected with the first sidewalls. The first rotating member is disposed between the first sidewall and the second shaft case.

In an implementation, the first sidewall has a first positioning portion. The second shaft case further has a second positioning portion. The first position portion and the second positioning portion cooperate with each other to allow the second shaft case to be connected with the first sidewall. The first rotating member is sleeved on the first positioning portion or the second positioning portion.

In an implementation, the second sidewall has a third rotating portion. The second rotating member has a fourth rotating portion. The third rotating portion and the fourth rotating portion cooperate with each other to allow the second rotating member to be rotatably connected with the second sidewall.

In an implementation, the electronic assembly further includes a synchronization mechanism. The first rotating members are at least partially disposed at the two opposite sides of the first shaft case are a first sub-rotating member and a second sub-rotating member. The synchronization mechanism is connected with the first sub-rotating member and the second sub-rotating member to allow the first sub-rotating member and the second sub-rotating member to synchronously rotate.

In an implementation, the synchronization mechanism includes a first gear and a second gear, the first sub-rotating member is rotatably connected with the first gear. The first gear is rotatably connected with the second gear. The second gear is rotatably connected with the second sub-rotating member.

In an implementation, the first rotating member has multiple teeth on a peripheral side surface of the first rotating member. The multiple teeth are arranged around at least one quarter of the peripheral side surface of the first rotating member.

In an implementation, the synchronization mechanism includes a first bracket and a second bracket connected with the first bracket, a first internal gear and a second internal gear, and a first spur gear and a second spur gear. The first bracket and the second bracket are received in the first shaft case. The first bracket defines a first receiving space therein. The second bracket defines a second receiving space therein. The first internal gear is received in the first receiving space and rotatable relative to the first bracket. The second internal gear is received in the second receiving space and rotatable relative to the second bracket. The first sub-rotating member is connected with the first internal gear. The second sub-rotating member is connected with the second internal gear. The first internal gear defines a first accommodating space therein. The second internal gear defines a second accommodating space therein. The first spur gear has a first sub-spur gear received in the first accommodating space and a second sub-spur gear disposed outside the first accommodating space. The first sub-spur gear is rotatably connected with the first internal gear. The second spur gear has a third sub-spur gear received in the second accommodating space and a fourth sub-spur gear disposed outside the second accommodating space. The third sub-spur gear is rotatably connected with the second internal gear. The fourth sub-spur gear is rotatably connected with the second sub-spur gear. When the first sub-rotating member rotates, the first internal gear, the second internal gear, the first spur gear, and the second spur gear cooperate to allow the first sub-rotating member and the second sub-rotating member to synchronously rotate.

In an implementation, the second sub-spur gear has a diameter larger than the first sub-spur gear, the fourth sub-spur gear has a diameter larger than the third sub-spur gear.

In an implementation, the first shaft case further has a baffle plate. The baffle plate, the first sidewall, and the second sidewalls arranged oppositely define a third receiving space. The electronic assembly further includes a damping mechanism at least partially received in the third receiving space. The damping mechanism includes an elastic member, a first limiting portion, and a second limiting portion. The first limiting portion has one end extended through the first sidewall and connected with the first gear and the other end abutted against one end of the elastic member. The second limiting portion has one end extended through the first sidewall and connect with the second gear and the other end abutted against the end of the elastic member. The elastic member has the other end connected with the baffle plate and the elastic member is in a compressed state.

In an implementation, the damping mechanism further includes a third limiting portion. The third limiting portion has one end connected with the elastic member and the other end abutted against the first limiting portion and the second limiting portion.

In an implementation, a side surface of the first limiting portion close to the third limiting portion is a first flat surface. A side surface of the third limiting portion close to the first limiting portion is a second flat surface. The first limiting portion has a first protruding portion protruded from part of the first flat surface. The first protruding portion has a first inclined surface connected with the first flat surface. The third limiting portion has a second protruding portion protruded from part of the second flat surface. The second protruding portion has a second inclined surface connected with the second flat surface. When the electronic assembly is in unfolded state, the first flat surface abuts against the second flat surface, and the first inclined surface abuts against the second inclined surface. When the electronic assembly rotates, the first inclined surface abuts against the second inclined surface.

In an implementation, the first protruding portion further has a third flat surface connected with the first inclined surface. The third flat surface is parallel to the first flat surface. The second protruding portion further has a fourth flat surface connected with the second inclined surface. The fourth flat surface is parallel to the second flat surface. When the electronic assembly is folded to a predetermined angle, the third flat surface abuts against the fourth flat surface.

An electronic device is further provided in the implementations of the disclosure. The electronic device includes a flexible screen and the electronic assembly provided in the foregoing implementations of the disclosure. The flexible screen is mounted on the movable plate of the electronic assembly.

In an implementation, the first shaft case defines an avoidance groove on one side of the first shaft case close to the flexible screen. The avoidance groove is configured to receive part of the flexible screen when the electronic device is bent.

Before describing technical solutions of the disclosure, technical problems in the related art are introduced below in detail.

In flexible electronic devices, the shaft assembly is one of important structural components to control folding/unfolding of the flexible electronic device. There are many kinds of shaft assemblies, usually named by the number of plates which are in the shaft assembly and for supporting a flexible screen, such as a two-plate shaft assembly, a four-plate shaft assembly, and a five-plate shaft assembly. In a case that the shaft assembly has a larger number of plates (for example, five plates), a gap will exist between two adjacent plates, and thus the five-plate shaft assembly will have one more gap and one more step (also known as a mismatch gap) than the four-plate shaft assembly, which will adversely affect surface effect of the flexible screen. This happens because, firstly, there will be no rigid support for the flexible screen at a position opposite to the gap, and secondly, the gap will also affect flushness between two adjacent panels, which results in a height difference of the flexible screen at different positions, and eventually adversely affects the surface effect of the flexible screen. The four-plate shaft assembly in the related art has a complex structure and a larger number of components, more gaps exist, and there is an assembly tolerance between each two components, which may increase total gaps, increase the size of a dimensional chain, increase a tolerance accumulation, enlarge displacements after falling (that is, displacements of the components of the shaft assembly when the flexible electronic device falls), and decline a quality of the shaft assembly.

In view of above, an electronic assembly is provided in the disclosure, and a first rotating member and a second rotating member cooperate with each other to allow the electronic assembly to be folded/unfolded, which simplifies a shaft assembly in structure and improves a quality of the shaft assembly.

Figure 2:
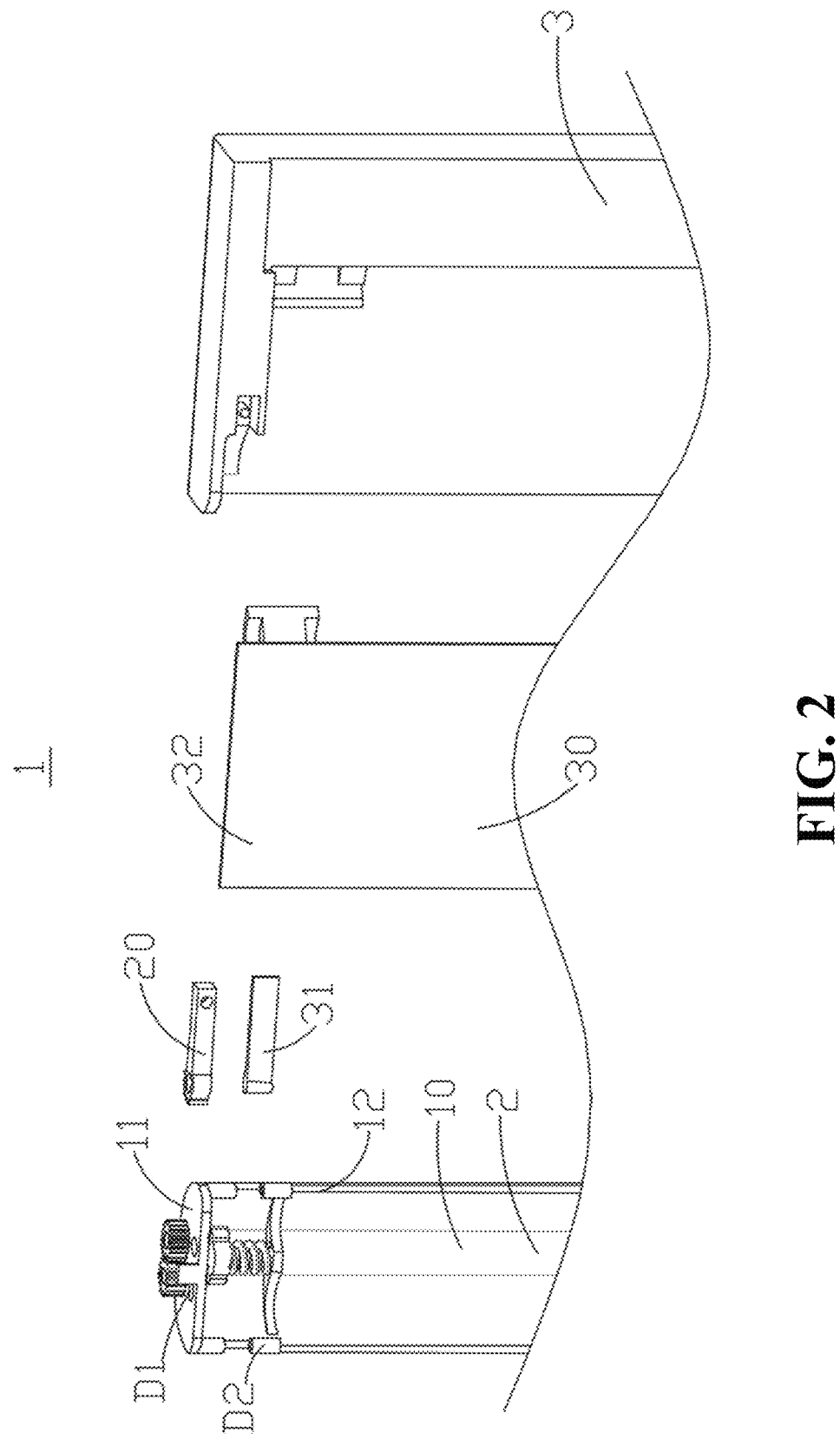
FIG. 2 is a partial exploded view of an electronic assembly in an implementation of the disclosure.
Figure 3:
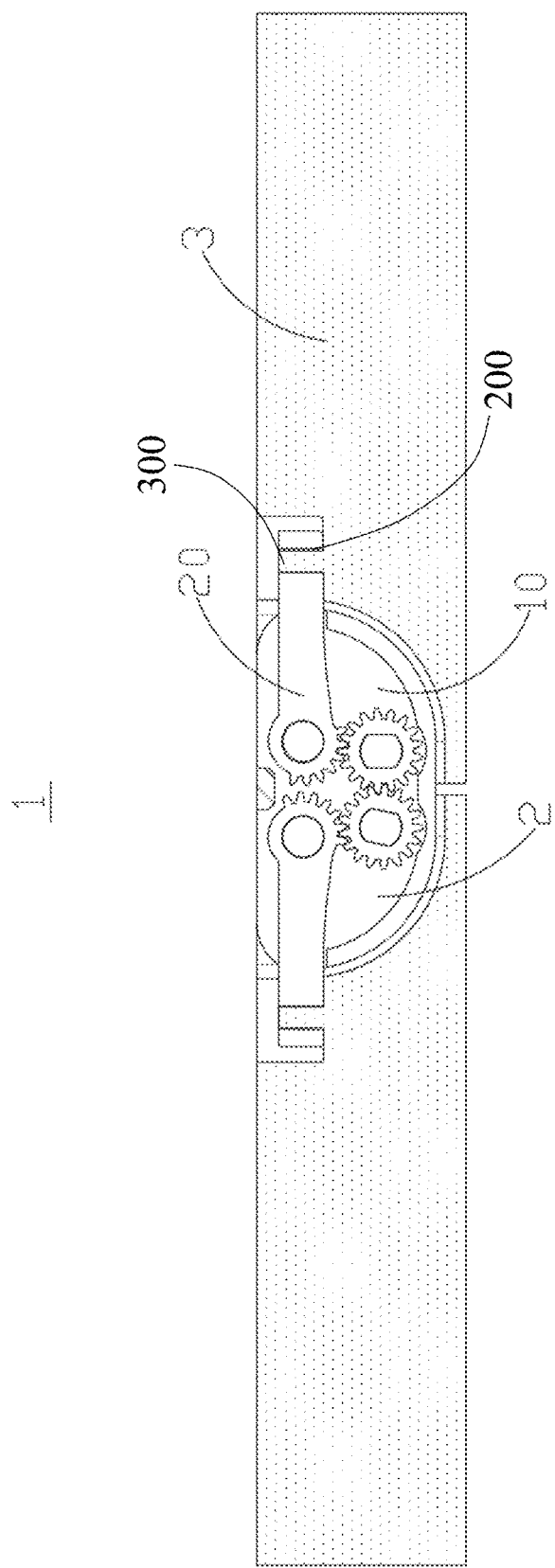
FIG. 3 is a schematic cross-sectional view of FIG. 1 along line A-A.
Figure 4:
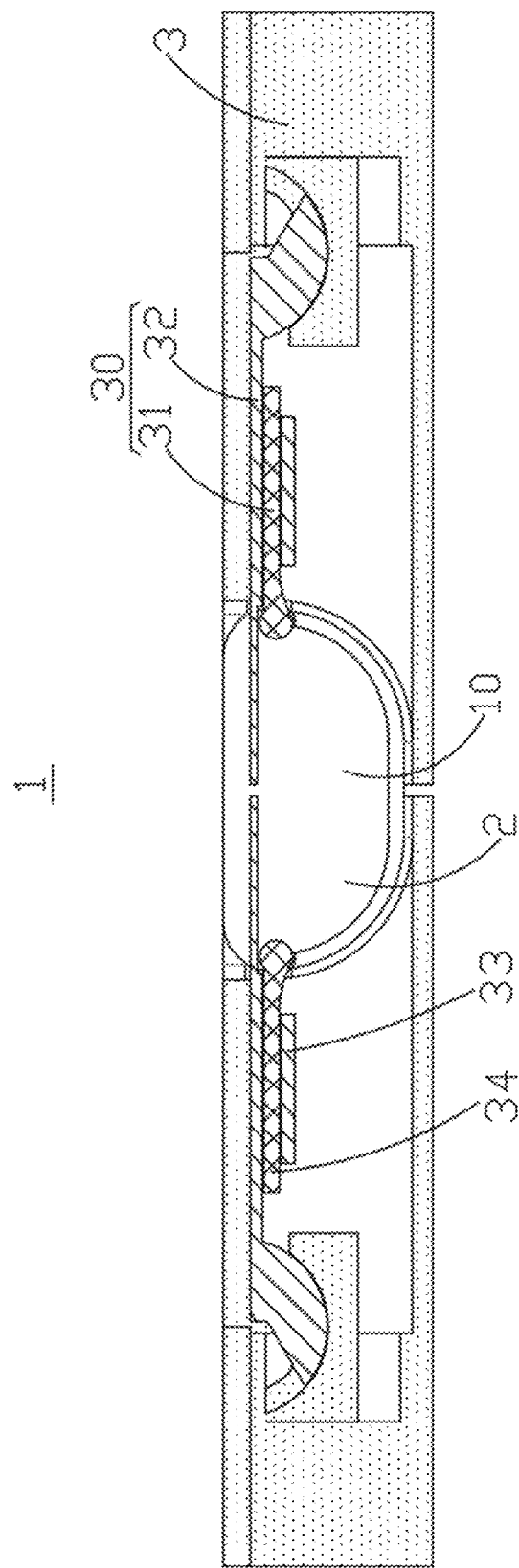
FIG. 4 is a schematic cross-sectional view of FIG. 1 along line B-B.
Figure 5:
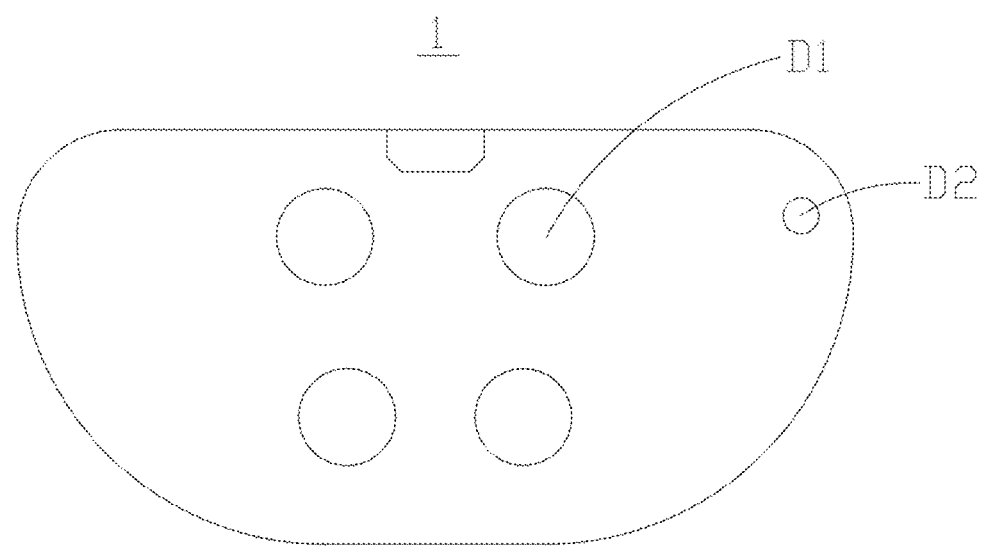
FIG. 5 is a schematic view of a first sidewall of a first shaft case in an implementation of the disclosure.

Referring to FIGS. 1-4, FIG. 1 is a partial top view of an electronic assembly in an implementation of the disclosure, FIG. 2 is a partial exploded view of an electronic assembly in an implementation of the disclosure, FIG. 3 is a schematic cross-sectional view of FIG. 1 along line A-A, and FIG. 4 is a schematic cross-sectional view of FIG. 1 along line B-B. An electronic assembly 1 is provided in the disclosure. The electronic assembly 1 includes a shaft assembly 2 and housings 3 arranged oppositely. The shaft assembly 1 includes a first shaft case 10, first rotating members 20, and rotating units 30. The housings 3 are at least partially disposed at two opposite sides of the first shaft case 10. The first rotating members 20 are at least partially disposed at the two opposite sides of the first shaft case 10. Each of the first rotating members 20 has one end rotatably connected with the first shaft case 10 and the other end connected with the housings 3. The rotating units 30 are at least partially disposed at the two opposite sides of the first shaft case 10. Each of the rotating units 30 includes a second rotating member 31 and a movable plate 32. The second rotating member 31 has one end rotatably connected with the first shaft case 10 and the other end connected with the movable plate 32. The movable plate 32 has one end connected to the housings 3. A rotation axis A1 around which the first rotating member 20 is rotatable relative to the first shaft case 10 is parallel to a rotation axis A2 around which the second rotating member 31 is rotatable relative to the first shaft case 10.

The electronic assembly 1 provided in the disclosure includes the shaft assembly 2 and the housings 3 arranged oppositely. In an implementation, the shaft assembly 2 includes the first shaft case 10. Firstly, the first shaft case 10 can serve as a carrier for other rotating components of the shaft assembly 2, that is, the rotating components are arranged on the first shaft case 10 and can rotate around some points on the first shaft case 10. Secondly, the first shaft case 10 can also be used to receive some other components in the shaft assembly 2, that is, some components are mounted in the first shaft case 10, which saves space. Furthermore, the first shaft case 10 can also serve as a protective case for the electronic assembly 1 and an electronic device 4, that is, the first shaft case 10 serves as part of a housing of the electronic device 4, thereby protecting components within the electronic device 4. FIG. 2 only illustrates the first shaft case 10 and structures at one side of the first shaft case 10, structures at the other side of the first shaft case 10 are the same as and arranged symmetrically with the structures at the one side of the first shaft case 10.

Additionally, the housings 3 of the disclosure are at least partially disposed at the two opposite sides of the first shaft case 10. The housings 3 and the first shaft case 10 provided in the disclosure can corporately serve as the housing of the electronic device 4. In this implementation, as illustrated in FIG. 1, part of the housings 3 are disposed at the two opposite sides of the first shaft case 10, and the rest of the housings 3 are disposed at the other two opposite sides of the first shaft case 10 connected with the two opposite sides, which allows the first shaft case 10 to be substantially accommodated in a space surrounded by the housing 3, and the first shaft case 10 is protected by the housing 3 to a certain extent.

As illustrated in FIG. 3, the shaft assembly 2 provided in the disclosure further includes the first rotating members 20 at least partially disposed at the two opposite sides of the first shaft case 10. The first rotating member 20 can be regarded as a rotatable member. In an implementation, the first rotating member 20 is rotatably connected to the first shaft case 10, that is, the first rotating member 20 can rotate around a certain point on the first shaft case 10. The first rotating member 20 is fixedly connected with the housing 3 at the other end of the first rotating member 20. As such, when the first rotating member 20 rotates relative to the first shaft case 10, the first rotating member 20 can drive the housing 3 to rotate together. In this implementation, as an example, part of the first rotating members 20 is disposed at two opposite sides of the first shaft case 10, and the rest of the first rotating members 20 is disposed at the other sides of the first shaft case 10 for connecting the first shaft case 10. In an implementation, the first rotating member 20 can be rotatably connected to the first shaft case 10 directly. Alternatively, the first rotating member 20 can also be connected to the first shaft case 10 indirectly, so as to make the first rotating member 20 rotatable relative to the first shaft case 10. In an implementation, the other end of the first rotating member 20 can be fixedly connected to the housing 3. Alternatively, the other end of the first rotating member 20 can be movably connected to the housing 3 (as illustrated in FIG. 3). In an implementation, as illustrated in FIG. 3, the first rotating member 20 defines a rotary hole 200 on the other end of the first rotating member 20, the housing 3 has a rotary shaft 300, and the rotary shaft 300 is rotatably received in the rotary hole 200, that is, the rotary hole 200 and the rotary shaft 300 cooperate with each other to allow the first rotating member 20 to be rotatable relative to the housing 3.

As illustrated in FIG. 4, the shaft assembly 2 provided in the disclosure further includes the rotating units 30 at least partially disposed at the two opposite sides of the first shaft case 10. Each of the rotating units 30 includes the second rotating member 31 and the movable plate 32. The second rotating member 31 is also a rotatable member. The second rotating member 31 is rotatably connected with the first shaft case 10 at one end of the second rotating member 31. That is, the second rotating member 31 can rotate around a certain point on the first shaft case 10. The second rotating member 31 is connected with the movable plate 32 at the other end of the second rotating member 31. In the electronic device 4, the flexible screen 5 needs to be disposed on the housings 3, meanwhile, the flexible screen 5 needs to be supported at a bottom surface thereof by a rigid structure. Thus, in the disclosure, the flexible screen 5 can be supported by the movable plate 32.

In addition, the movable plate 32 is connected with the housing 3 at one end of the movable plate 32 and is connected with the second rotating member 31 at the other end of the movable plate 32. In an implementation, when the housing 3 is subjected to a rotary force (for example, a torque), the first rotating member 20 can rotate relative to the first shaft case 10 to drive the housing 3 to rotate. Rotation of the housings 3 can also make the second rotating member 31 rotate, and the movable plates 32 can also rotate together under the action of the second rotating members 31 and eventually drive the flexible screen 5 disposed on the movable plate 32 to be folded/unfolded, which can realize bending of the flexible screen 5. In an implementation, the second rotating member 31 may be directly connected with the first shaft case 10 at one end of the second rotating member 31, or the second rotating member 31 may be indirectly connected with the first shaft case 10 at the end of the second rotating member 31. In an implementation, the second rotating member 31 can be fixedly connected with the movable plate 32 at the other end of the second rotating member 31, or the second rotating member 31 can be slidably connected with the movable plate 32 at the other end of the second rotating member 31. In an implementation, the movable plate 32 can be fixedly connected with the housing 3 at one end of the movable plate 32, or the movable plate 32 can be rotatably connected with the housing 3 at the end of the movable plate 32. In an implementation, since the shaft assembly 2 includes two movable plates 32, the shaft assembly 2 of the disclosure can be regarded as a two-plate shaft assembly 2. Alternatively, when taking the housings 3 arranged oppositely into account, the shaft assembly 2 of the disclosure can also be regarded as a four-plate shaft assembly 2.

To sum up, the electronic assembly 1 provided in the disclosure has a simple structure, in which the first rotating members 20 is cooperated with the second rotating members 31, the first rotating member 20 is connected with the first shaft case 10 and the housing 3, the second rotating member 31 is connected with the first shaft case 10 and the movable plate 32, and the movable plate 32 is connected with the housing 3, which realizes bending of the electronic assembly 1, reduces an accumulated amount of the displacements after falling, and improves the quality of the shaft assembly 2.

In an implementation, referring to FIG. 2, in this implementation, the first shaft case 10 has first sidewalls 11 arranged oppositely and second sidewalls 12 arranged oppositely. Each of the second sidewalls 12 is connected with the first sidewalls 11 arranged oppositely. The first rotating member 20 is rotatably connected to the first sidewall 11. The second rotating member 31 is rotatably connected to the second sidewall 12.

In this implementation, the first rotating member 20 and the second rotating member 31 can be arranged on different sidewalls respectively, which can avoid a risk of collision during rotation when the first sub-rotating member and the second rotating member 31 are arranged on the same sidewall. Moreover, arranging the first rotating member 20 and the second rotating member 31 on different sidewalls can also facilitate a subsequent crank-slider movement.

Referring to FIGS. 2-5, FIG. 5 is a schematic view of a first sidewall of a first shaft case in an implementation of the disclosure. In this implementation, an orthographic projection of a rotation center (as illustrated by D2 in FIG. 5) of the second rotating member 31 on the first sidewall 11 is spaced apart from a rotation center (as illustrated by D1 in FIG. 5) of the first rotating member 20.

In the electronic assembly 1 provided in the disclosure, the flexible screen 5 can be mounted on the movable plates 32 and the housings 3, and bending of the flexible screen 5 can realized by controlling bending of the electronic assembly 1. According to a shape of the flexible screen 5 after being bent, the flexible screen 5 can generally be classified into two types: "U-shaped screen" and "drop-shaped screen". "U-shaped screen" means that the flexible screen 5 after being bent is in a shape of the letter U. "Drop-shaped screen" means that the flexible screen 5 after being bent is in a shape of a water drop, that is, the flexible screen 5 after being bent has a structure that is wide at the bottom and narrow at the top. A "U-shaped screen" can make the overall electronic device 4 thicker, while a "drop-shaped screen" can make the overall electronic device 4 thinner. In an implementation, the orthographic projection of the rotation center of the second rotating member 31 on the first sidewall 11 can coincide with the rotation center of the first rotating member 20, that is, the first rotating member 20 and the second rotating member 31 are rotated coaxially, which allows the flexible screen 5 to be a "U-shaped screen" after installation and being bent. In this implementation, the orthographic projection of the rotation center of the second rotating member 31 on the first sidewall 11 can be spaced apart from the rotation center of the first rotating member 20, that is, the rotation center of the first rotating member 20 does not coincide with the rotation center of the second rotating member 31, and the first rotating member 20 and the second rotating member 31 do not rotate coaxially. In this way, when the first rotating member 20 and the second rotating member 31 are rotated, a crank-slider movement is formed, so that the movable plate 32 is inclined at an angle relative to the first rotating member 20 and the housing 3, and a drop-shaped screen is eventually formed. It is noted that, the crank-slider movement refers to that when the movable plate 32 rotates relative to the housing 3, the movable plate 32 will also slide relative to the first shaft case 10.

Figure 6:
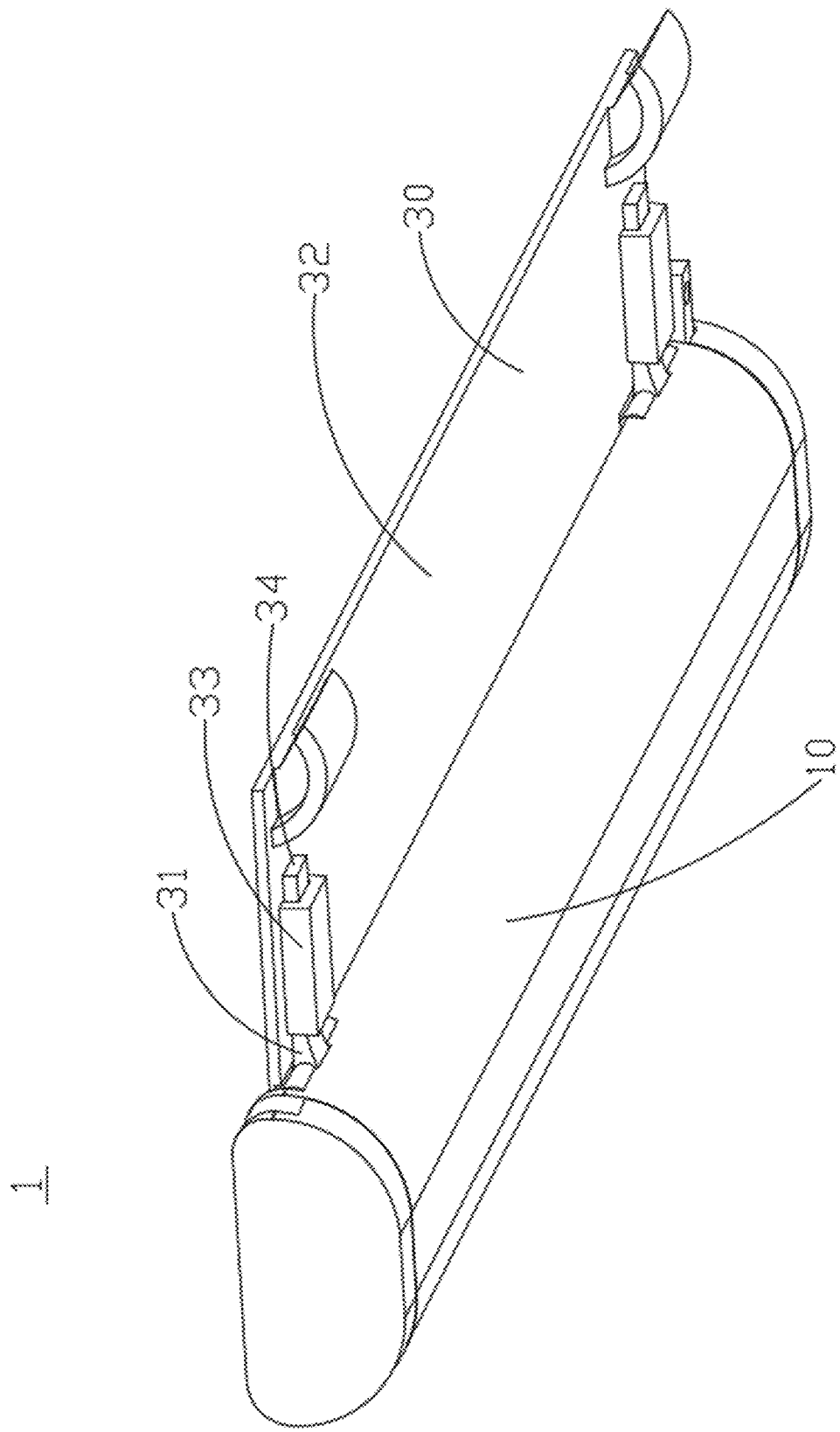
FIG. 6 is a schematic perspective structural view of a first shaft case and a rotating unit in another implementation of the disclosure.
Figure 7:
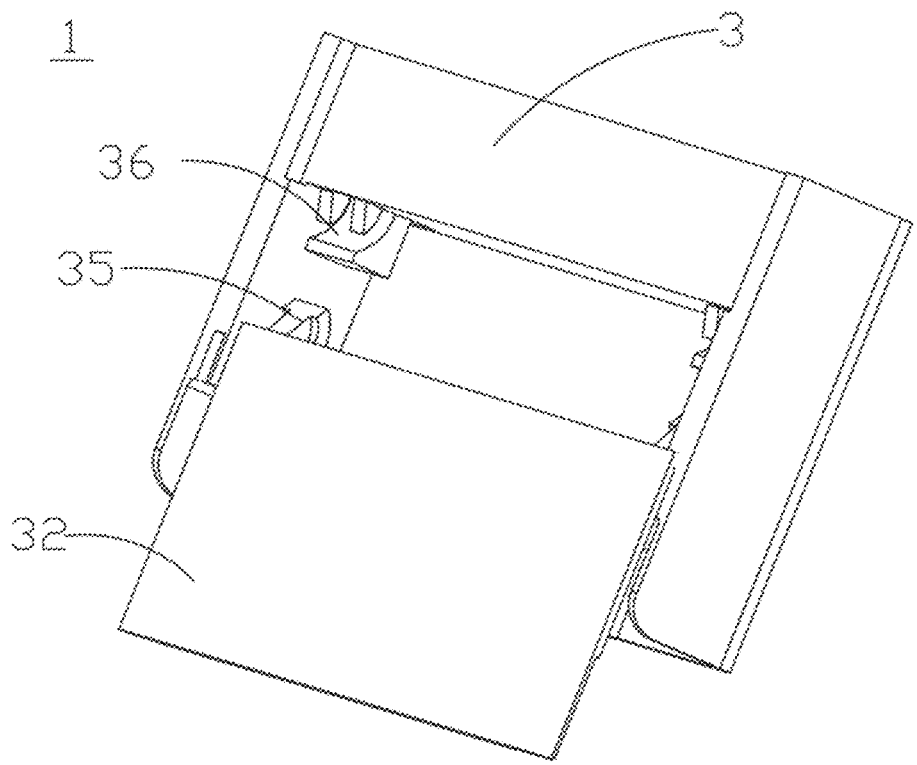
FIG. 7 is a schematic perspective structural view of a movable plate and a housing in another implementation of the disclosure.

Referring to FIG. 4 and FIG. 6 together, FIG. 6 is a schematic perspective structural view of a first shaft case and a rotating unit in another implementation of the disclosure. In this implementation, the movable plate 32 has a first sliding portion 33. The second rotating member 31 has a second sliding portion 34. The first sliding portion 33 and the second sliding portion 34 cooperate with each other to allow the movable plate 32 to slide relative to the second rotating member 31.

As can be seen from above, the drop-shaped screen can be formed by the crank-slider movement. In order to realize the crank-slider movement, the disclosure can control and compensate the movable plate 32 or the housing 3, to increase a distance between one end of the movable plate 32 or the housing 3 away from the first shaft case 10 and the first shaft case 10, such that the electronic assembly 1 can be folded/unfolded normally, and the drop-shaped screen is eventually realized. In this implementation, it is realized by controlling and compensating the movable plate 32. In an implementation, the movable plate 32 may have the first sliding portion 33, and the second rotating member 31 may have the second sliding portion 34. The movable plate 32 is slidable relative to the second rotating member 31 by mutual cooperation between the first sliding portion 33 and the second sliding portion 34. In an implementation, the first sliding portion 33 may be a sliding groove or a sliding block, and the second sliding portion 34 may be a sliding block or a sliding groove. It can also be understood that when the first sliding portion 33 is a sliding groove, the second sliding portion 34 is a sliding block. When the first sliding portion 33 is a sliding block, the second sliding portion 34 is a sliding groove. In this implementation, as an example, the first sliding portion 33 is a sliding groove, and the second sliding portion 34 is a sliding block.

Referring to FIGS. 4-7, FIG. 7 is a schematic perspective structural view of a movable plate and a housing in another implementation of the disclosure. In this implementation, the movable plate 32 has a first rotating portion 35 at one end thereof. The housing 3 has a second rotating portion 36. The first rotating portion 35 and the second rotating portion 36 cooperate with each other to allow the movable plate 32 to be rotatably connected with the housing 3.

As can be seen from above, when the crank-slider movement is performed, both the movable plates 32 and the housings 3 will rotate, and the disclosure is implemented by compensating the movable plates 32. In order to achieve the drop-shaped screen, in the disclosure, the movable plate 32 will also be inclined at an angle with relative to the first rotating member 20 and the housing 3 after the crank-slider movement, that is, the movable plate 32 will also rotate relative to the housing 3. Therefore, in this implementation, the movable plate 32 has the first rotating portion 35 at one end of the movable plate 32, and the housing 3 has the second rotating portion 36. The movable plate 32 is rotatable relative to the housing 3 through cooperation between the first rotating portion 35 and the second rotating portion 36. In an implementation, the first rotating portion 35 may be a guide rail or a sliding groove, and the second rotating portion 36 may be a sliding groove or a guide rail. It can also be understood that when the first rotating portion 35 is a guide rail, the second rotating portion 36 is a sliding groove. When the first rotating portion 35 is a sliding groove, the second rotating portion 36 is a guide rail. In this implementation, as an example, the first rotating portion 35 is a guide rail and the second rotating portion 36 is a sliding groove.

Figure 8:
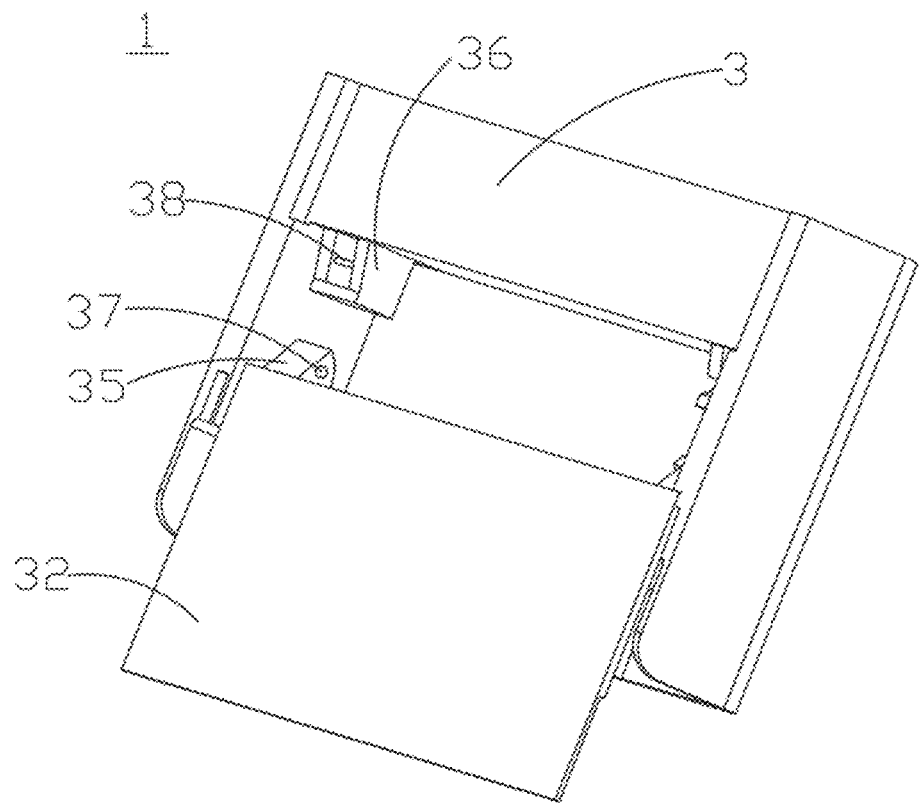
FIG. 8 is a schematic perspective structural view of a movable plate and a housing in another implementation of the disclosure.

Referring to FIG. 8, which is a schematic perspective structural view of a movable plate and a housing in another implementation of the disclosure. In this implementation, the first rotating portion 35 defines a rotating hole 37. The second rotating portion 36 has a rotating member 38. The first rotating portion 35 is sleeved with the rotating member 38 through the rotating hole 37 to allow the movable plate 32 to be rotatably connected with the housing 3. In another implementation provided in the disclosure, the first rotating portion 35 defines the rotating hole 37, the second rotating portion 36 has the rotating member 38, and the first rotating portion 35 is sleeved on the rotating member 38. In this way, the first rotating portion can rotate around the rotating member 38, so that the movable plate 32 is rotatably connected with the housing 3 at one end of the movable plate 32, and thus the movable plate 32 can rotate relative to the housing 3.

Figure 9:
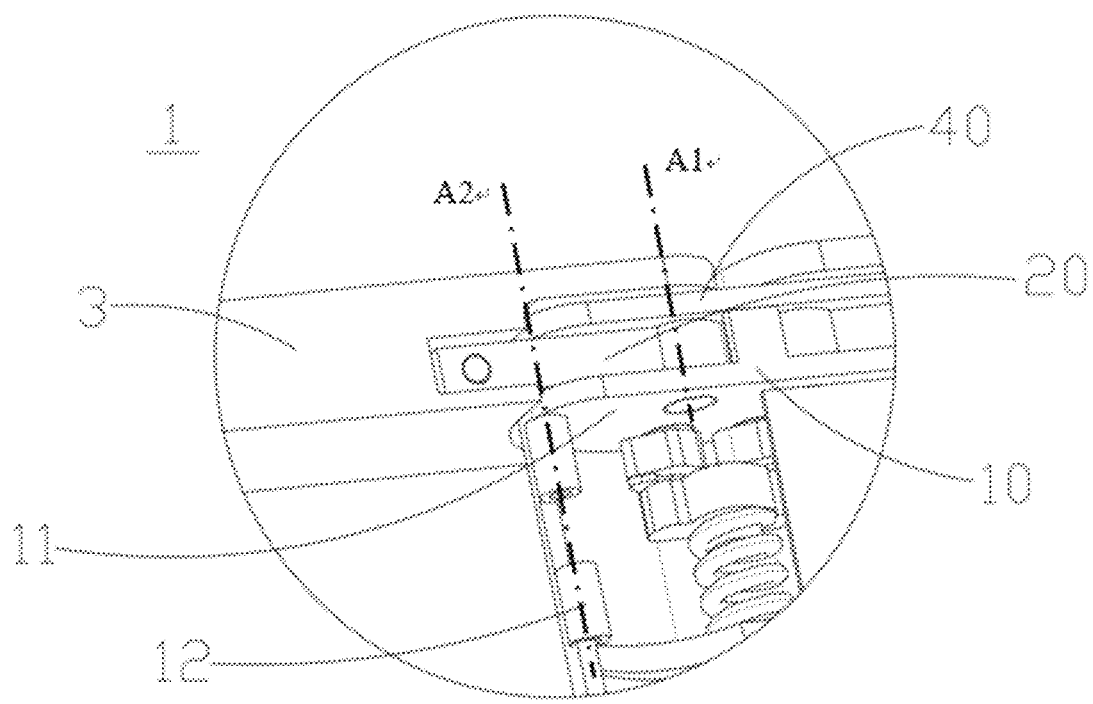
FIG. 9 is a partial schematic perspective structural view of an electronic assembly in another implementation of the disclosure.
Figure 10:
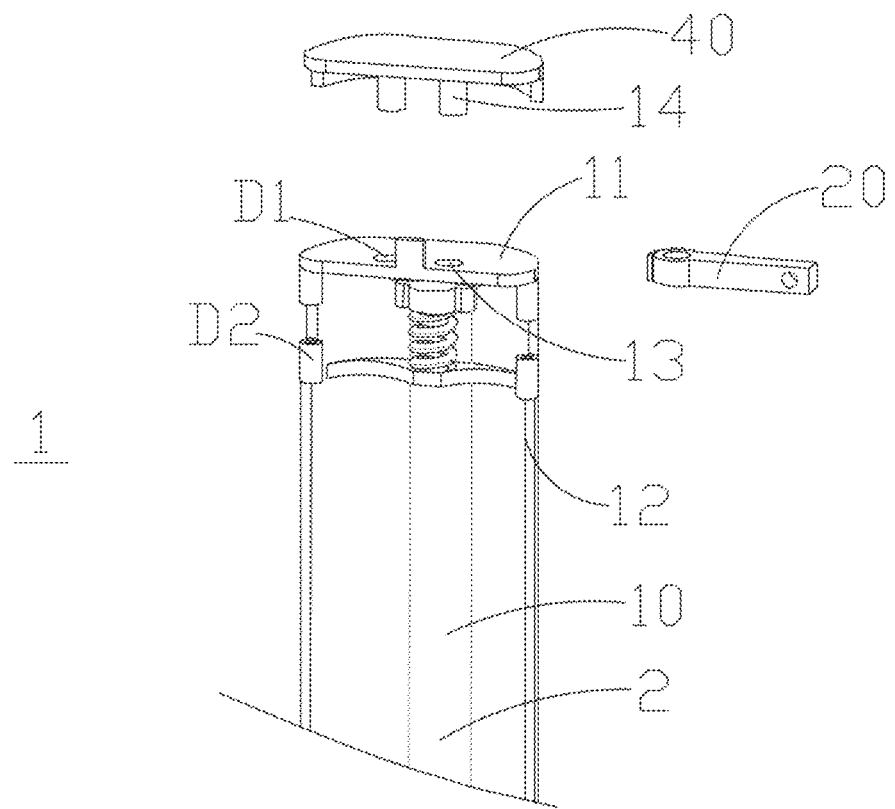
FIG. 10 is a partial schematic perspective structural view of a first shaft case, a second shaft case, and a first rotating member in another implementation of the disclosure.

Referring to FIG. 9 and FIG. 10, FIG. 9 is a partial schematic perspective structural view of an electronic assembly in another implementation of the disclosure, and FIG. 10 is a partial schematic perspective structural view of a first shaft case, a second shaft case, and a first rotating member in another implementation of the disclosure. In this implementation, the electronic assembly 1 further includes second shaft cases 40 connected with the first sidewalls 11. The first rotating member 20 is disposed between the first sidewall 11 and the second shaft case 40.

In the disclosure, a second shaft case 40 can be further provided. The second shaft case 40 can be disposed on one side of the first sidewall 11 and connected with the first sidewall 11. The first rotating member 20 is disposed between the first sidewall 11 and the second shaft case 40, so as to effectively protect the first rotating member 20 and prevent the first rotating member 20 from collision with external objects. Secondly, the second shaft case 40 and the first sidewall 11 can also cooperate with each other, so that the first rotating member 20 can be rotatably connected to the first shaft case 10 indirectly. Referring to FIG. 10, in this implementation, the first sidewall 11 has a first positioning portion 13. The second shaft case 40 further has a second positioning portion 14. The first position portion 13 and the second positioning portion 14 cooperate with each other to allow the second shaft case 40 to be connected with the first sidewall 11. The first rotating member 20 is sleeved on the first positioning portion 13 or the second positioning portion 14.

In the disclosure, the first sidewall 11 can define the first positioning portion 13. The second shaft case 40 has the second positioning portion 14. The first position portion 13 and the second positioning portion 14 cooperate with each other to allow the second shaft case 40 to be connected with the first sidewall 11. In an implementation, the first positioning portion 13 may be a groove or a bump, and the second positioning portion 14 may be a bump or a groove. It can also be understood that when the first positioning portion 13 is a groove, the second positioning portion 14 is a bump, and when the first positioning portion 13 is a bump, the second positioning portion 14 is a groove. In this implementation, the first positioning portion 13 is a groove, and the second positioning portion 14 is a bump. Secondly, the first rotating member 20 can also be sleeved on the first positioning portion 13 or the second positioning portion 14, that is, the first rotating member 20 can be sleeved on the bump for rotation. For example, in this implementation, the first rotating member 20 can be sleeved on the second positioning portion 14 of the second shaft case 40, so that the first rotating member 20 can be rotatably connected with the first rotating member 20 of the first shaft case 10 indirectly.

Figure 11:
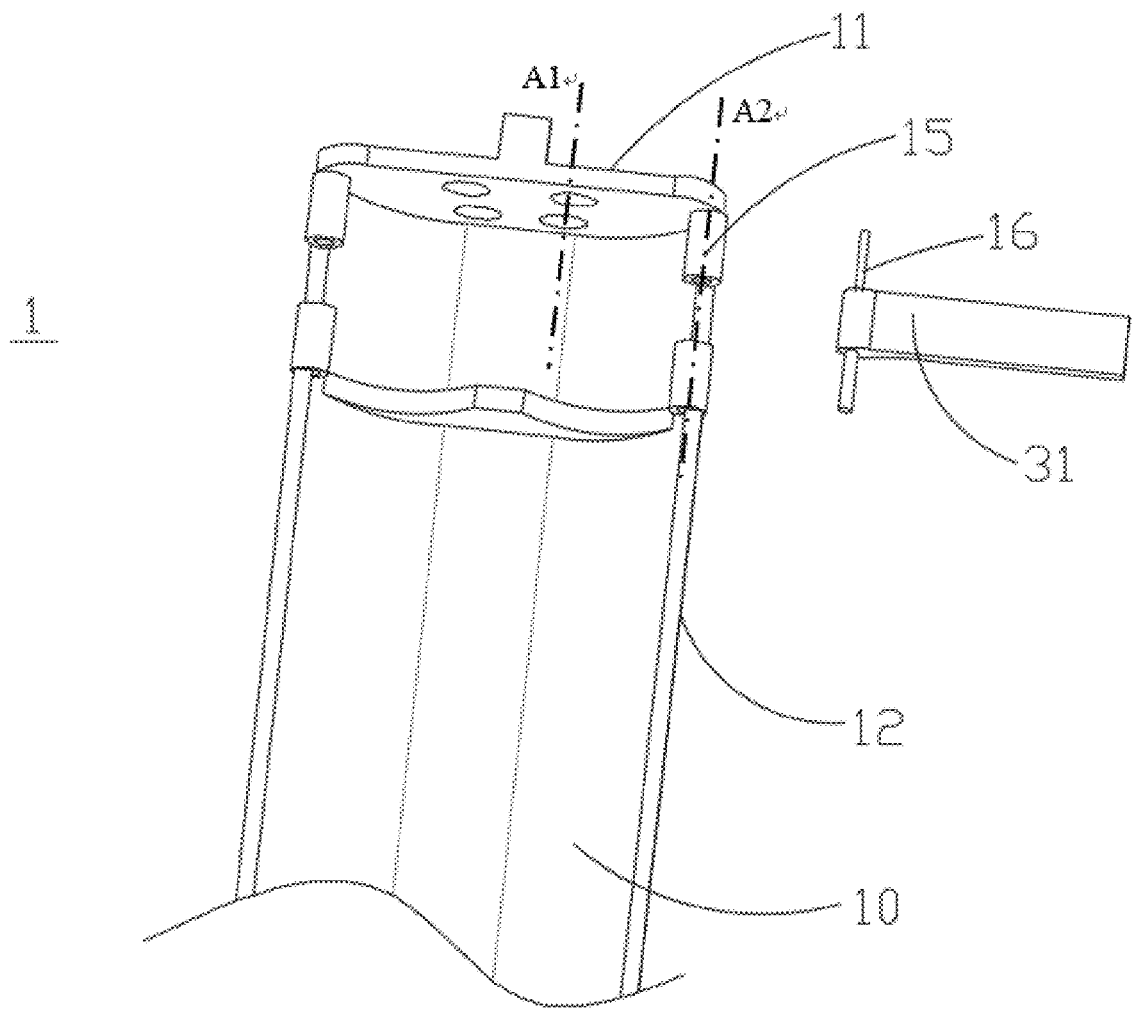
FIG. 11 is a partial schematic perspective structural view of a first shaft case and a second rotating member in an implementation of the disclosure.

Referring to FIG. 11, which is a partial schematic perspective structural view of a first shaft case and a second rotating member in an implementation of the disclosure. In this implementation, the second sidewall 12 has a third rotating portion 15. The second rotating member 31 has a fourth rotating portion 16. The third rotating portion 15 and the fourth rotating portion 16 cooperate with each other to allow the second rotating member 31 to be rotatably connected with the second sidewall 12.

In the disclosure, the second sidewall 12 is provided with the third rotating portion 15. The second rotating member 31 is provided with the fourth rotating portion 16. The third rotating portion 15 and the fourth rotating portion 16 cooperate with each other to allow the second rotating member 31 to be rotatably connected with the second sidewall 12. In an implementation, the third rotating portion 15 can be a rotating groove or a rotating shaft, and the fourth rotating portion 16 can be a rotating shaft or a rotating groove. It can also be understood that, when the third rotating portion 15 is a rotating groove, the fourth rotating portion 16 is a rotating shaft. When the third rotating portion 15 is the rotating shaft, the fourth shaft assembly 2 is the rotating groove. In this implementation, as an example, the third rotating portion 15 is the rotating groove, and the fourth rotating portion 16 is the rotating shaft. As illustrated in FIG. 11, the second sidewall 12 defines the rotating grooves which opposite to each other, and the second rotating member 31 has the rotating shafts on two opposite sides of the second rotating member 31. The second rotating member 31 can rotate relative to the first shaft case 10 by inserting the rotating shaft into the rotating groove.

Figure 12:
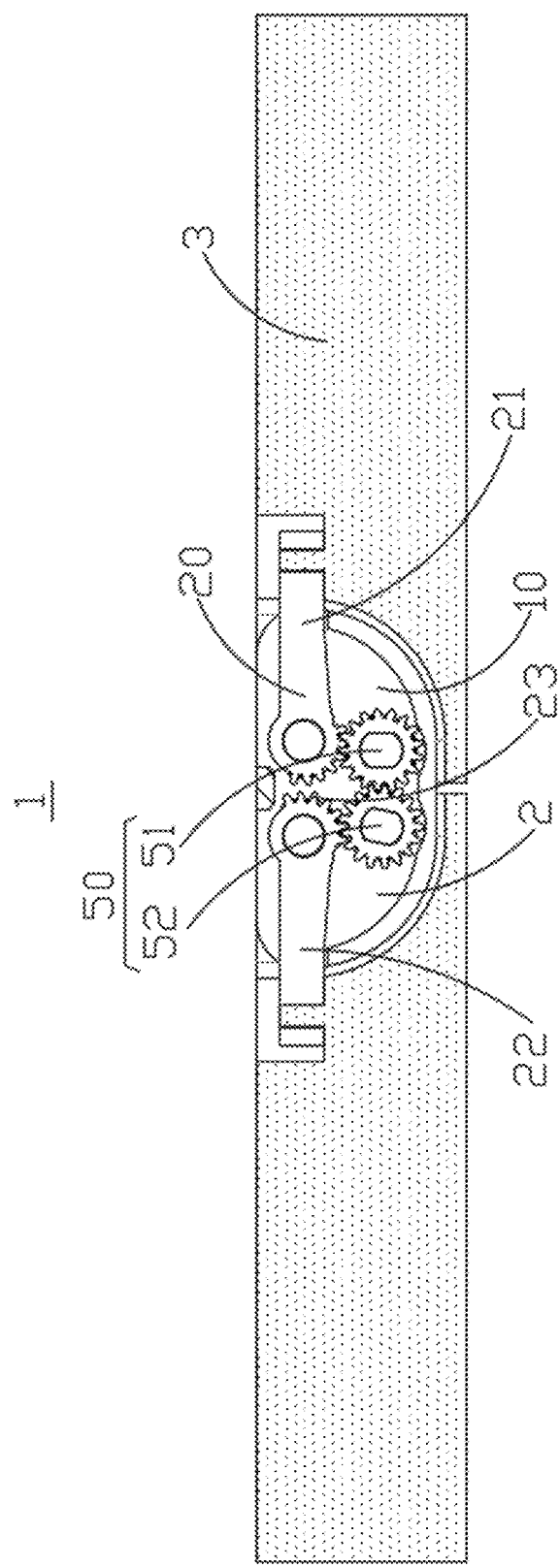
FIG. 12 is a schematic cross-sectional view of an electronic assembly in an implementation of the disclosure.

Referring to FIG. 12, which is a schematic cross-sectional view of an electronic assembly in an implementation of the disclosure. In this implementation, the first rotating members 20 at least partially disposed at the two opposite sides of the first shaft case 10 are a first sub-rotating member 21 and a second sub-rotating member 22. The electronic assembly 1 further includes a synchronization mechanism 50. The synchronization mechanism 50 is connected with the first sub-rotating member 21 and the second sub-rotating member 22 to allow the first sub-rotating member 21 and the second sub-rotating member 22 to synchronously rotate.

The first rotating members 20 of the disclosure are symmetrically arranged. That is, the first rotating members 20 (i.e., the first sub-rotating member 21 and the second sub-rotating member 22) are arranged at a left side and a right side of the first shaft case 10. In this disclosure, a synchronization mechanism 50 can be further provided. The synchronization mechanism 50 connects the first sub-rotating member 21 and the second sub-rotating member 22. As such, when the first sub-rotating member 21 rotates, with aid of the synchronization mechanism 50, the second sub-rotating member 22 can also rotate together, which makes the housings 3 and the movable plates 32 on the two opposite sides rotate together, symmetry effects when folding/unfolding the electronic assembly 1 are improved.

Referring to FIG. 12, in this implementation, the synchronization mechanism includes a first gear 51 and a second gear 52. The first sub-rotating member 21 is rotatably connected with the first gear 51. The first gear 51 is rotatably connected with the second gear 52. The second gear 52 is rotatably connected with the second sub-rotating member 22.

In the disclosure, the synchronization mechanism 50 can be implemented in two ways. In an implementation of the disclosure, the synchronization mechanism includes a first gear 51 and a second gear 52. The first gear 51 is rotatably connected with the first sub-rotating member 21 and the second gear 52. The second gear 52 is rotatably connected with the second sub-rotating member 22 and the first gear 51. When the first sub-rotating member 21 is rotated, the second sub-rotating member 22 can be rotated synchronously through transmission of the first gear 51 and the second gear 52.

Referring to FIG. 12, in this implementation, the first rotating member 20 has multiple teeth 23 on a peripheral side surface of the first rotating member 20. The multiple teeth 23 are arranged around at least one quarter of the peripheral side surface of the first rotating member 20.

In the disclosure, the first rotating member 20 can have multiple teeth 23 arranged on the peripheral side surface of the first rotating member 20. With aid of meshing between the teeth 23 with the first gear 51 and meshing between the teeth 23 and the second gear 52, rotational connections can be realized. One side of the electronic assembly 1 is usually rotated by at least 90°, and thus in the disclosure, the multiple teeth 23 are arranged around at least one quarter of the peripheral side surface of the first rotating member 20, and the number of the teeth 23 is determined according to a rotation angle, which reduces the weight of the first rotating member 20.

Figure 13:
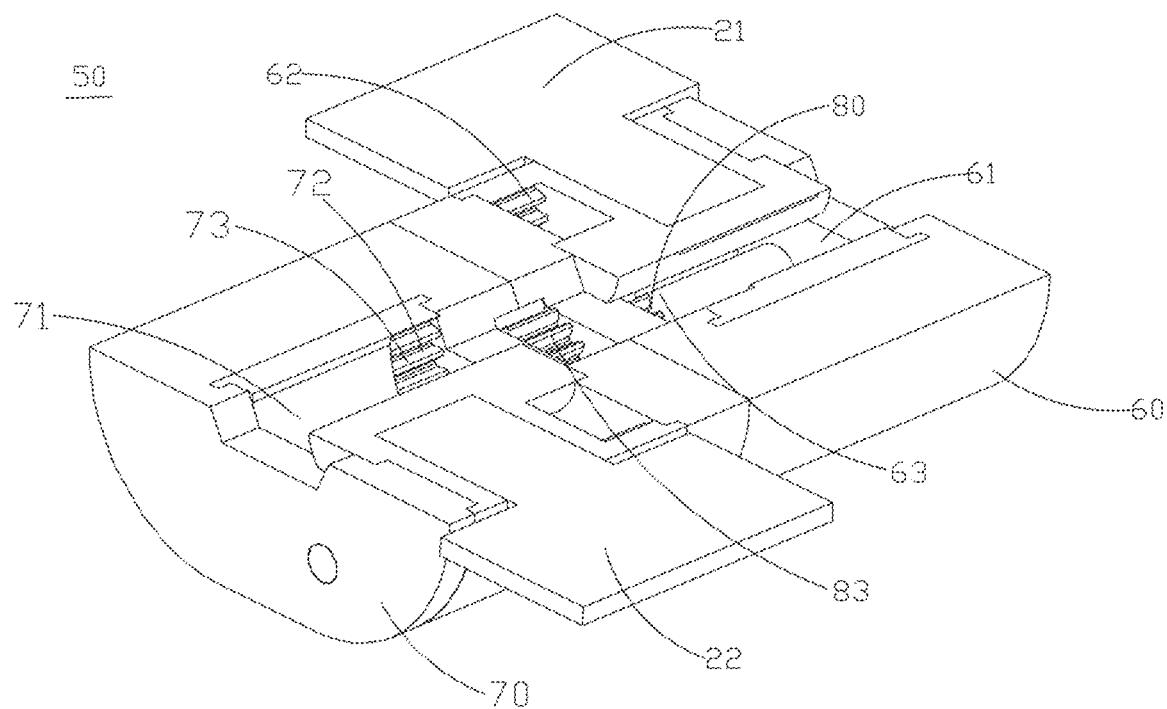
FIG. 13 is a schematic structural view of a synchronization mechanism in another implementation of the disclosure.
Figure 14:
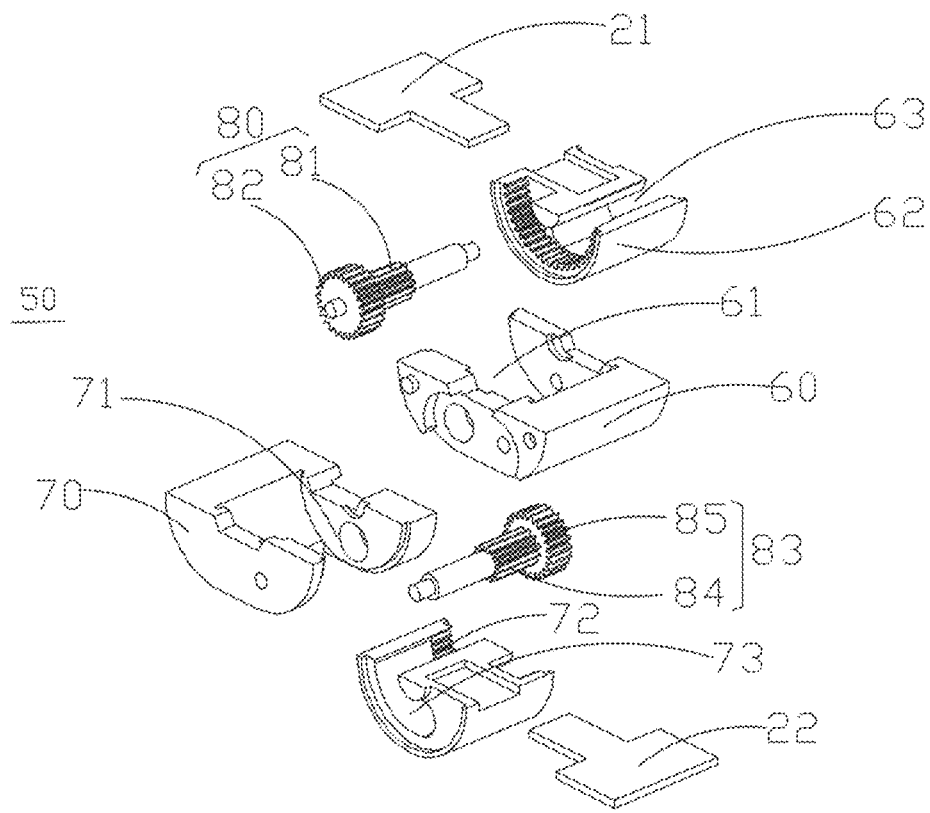
FIG. 14 is an exploded view of the synchronization mechanism illustrated in FIG. 13.
Figure 15:
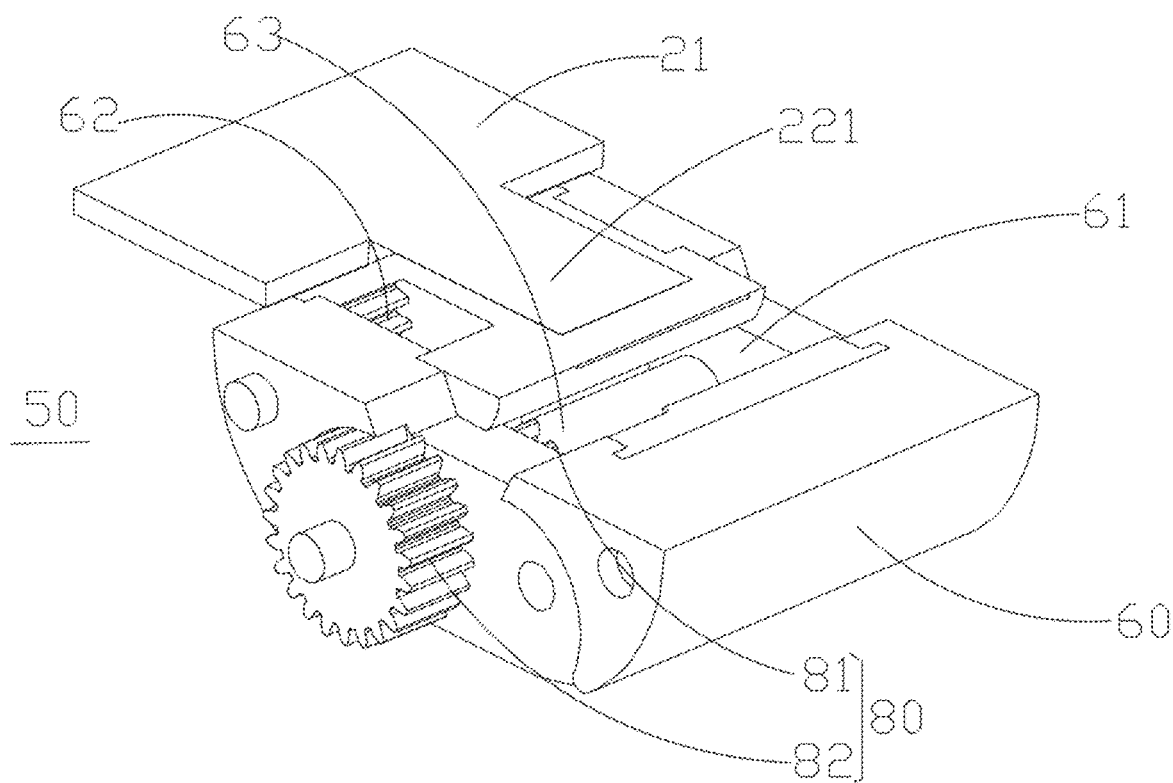
FIG. 15 is a schematic structural view of a first bracket, a first internal gear, a first rotating member, and a first spur gear in FIG. 13.
Figure 16:
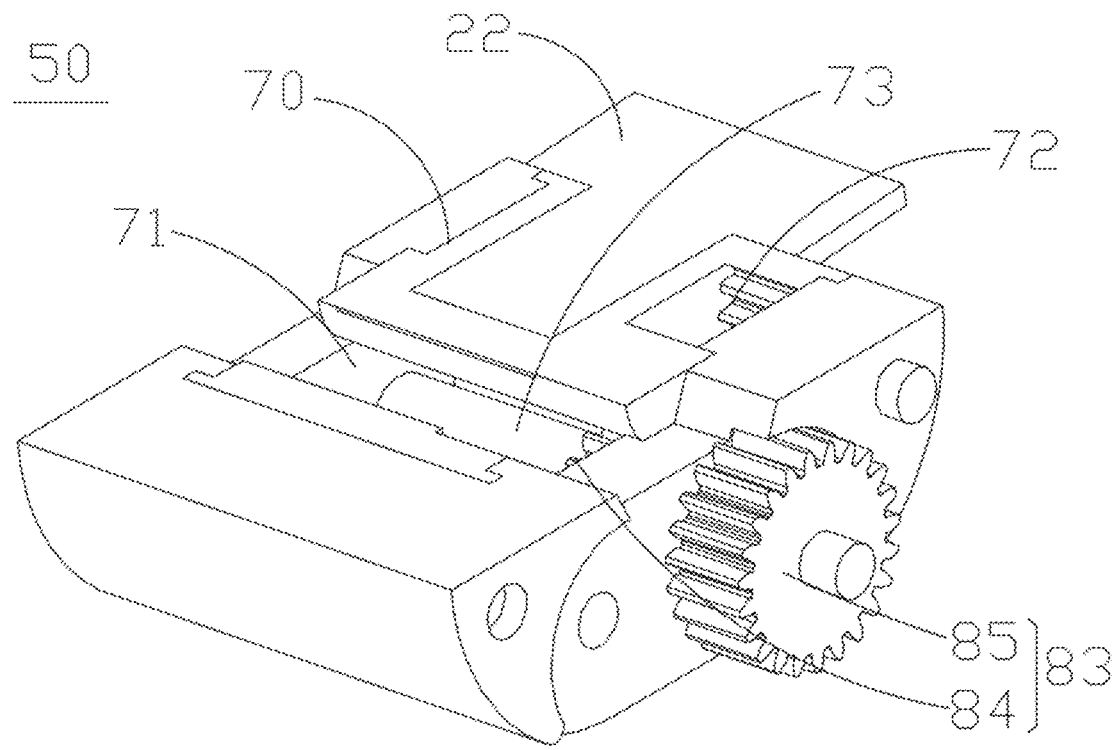
FIG. 16 is a schematic structural view of a second bracket, a second internal gear, a second rotating member, and a second spur gear in FIG. 13.
Figure 17:
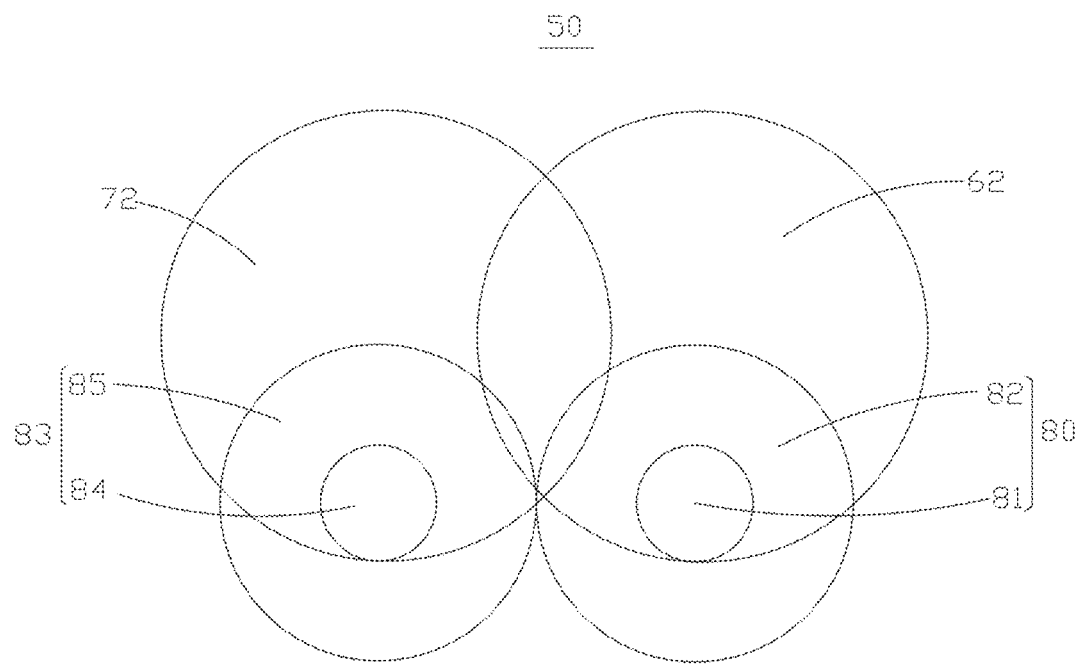
FIG. 17 is a schematic diagram illustrating cooperation of the first internal gear, the second internal gear, the first spur gear, and the second spur gear in FIG. 13.

Referring to FIGS. 13-17, FIG. 13 is a schematic structural view of a synchronization mechanism in another implementation of the disclosure, FIG. 14 is an exploded view of the synchronization mechanism illustrated in FIG. 13, FIG. 15 is a schematic structural view of a first bracket, a first internal gear, a first rotating member, and a first spur gear in FIG. 13, FIG. 16 is a schematic structural view of a second bracket, a second internal gear, a second rotating member, and a second spur gear in FIG. 13, and FIG. 17 is a schematic diagram illustrating cooperation of the first internal gear, the second internal gear, the first spur gear, and the second spur gear in FIG. 13. A synchronization mechanism 50 is also provided in the disclosure. In this implementation, the synchronization mechanism 50 can be received in the first shaft case 10. The synchronization mechanism 50 includes a first bracket 60 and a second bracket 70 connected with the first bracket 60, a first internal gear 62 and a second internal gear 72, and a first spur gear 80 and a second spur gear 83. The first bracket 60 and the second bracket 70 are received in the first shaft case 10. The first bracket 60 defines a first receiving space 61 therein. The second bracket 70 defines a second receiving space 71 therein. The first internal gear 62 is received in the first receiving space 61 and rotatable relative to the first bracket 60. The second internal gear 72 is received in the second receiving space 71 and rotatable relative to the second bracket 70. The first sub-rotating member 21 is connected with the first internal gear 62. The second sub-rotating member 22 is connected with the second internal gear 72. The first internal gear 62 defines a first accommodating space 63 therein. The second internal gear 72 defines a second accommodating space 73 therein. The first spur gear 80 has a first sub-spur gear 81 received in the first accommodating space 63 and a second sub-spur gear 82 disposed outside the first accommodating space 63. The first sub-spur gear 81 is rotatably connected with the first internal gear 62. The second spur gear 83 has a third sub-spur gear 84 received in the second accommodating space 73 and a fourth sub-spur gear 85 disposed outside the second accommodating space 73. The third sub-spur gear 84 is rotatably connected with the second internal gear 72. The fourth sub-spur gear 85 is rotatably connected with the second sub-spur gear 82. When the first sub-rotating member 21 rotates, the first internal gear 62, the second internal gear 72, the first spur gear 80, and the second spur gear 83 cooperate to allow the first sub-rotating member 21 and the second sub-rotating member 22 to synchronously rotate.

In the disclosure, the first bracket 60 is used for mounting the first internal gear 62 and the first spur gear 80, and the second bracket 70 is used for mounting the second internal gear 72 and the second spur gear 83. Further, in the disclosure, the first bracket 60 can be connected with the second bracket 70, which can reduce difficulty in forming gear pairs and reduce a size of the synchronization mechanism 50.

In the disclosure, the first internal gear 62 and the second internal gear 72 are further provided. In an implementation, an internal gear refers to a gear with teeth cut on an internal surface of a cylinder. In the disclosure, the first internal gear 62 is disposed within the first receiving space 61 and is rotatable relative to the first bracket 60. In addition, in the disclosure, the first sub-rotating member 21 is connected with the first internal gear 62. In this way, the first internal gear 62 in rotation can drive the first sub-rotating member 21 to rotate, such that the first sub-rotating member 21 is rotatably connected with the first shaft case 10 indirectly.

In the disclosure, the second internal gear 72 can also be received in the second receiving space 71 and rotatable relative to the second bracket 70. In addition, in the disclosure, the second sub-rotating member 22 is connected with the second internal gear 72. In this way, the second internal gear 72 in rotation can drive the second sub-rotating member 22 to rotate, such that the second sub-rotating member 22 is rotatably connected with the first shaft case 10 indirectly. In an implementation, the first receiving space 61 is used for receiving the first internal gear 62. As an example, a rotation direction of the first internal gear 62 is consistent with an arrangement direction of teeth of the first internal gear 62. The second receiving space 71 is used for receiving the second internal gear 72. As an example, a rotation direction of the second internal gear 72 is consistent with an arrangement direction of teeth of the second internal gear 72.

In the disclosure, the first spur gear 80 and the second spur gear 83 are further provided. The first spur gear 80 includes the first sub-spur gear 81 received in the first accommodating space 63 and the second sub-spur gear 82 disposed outside the first accommodating space 63. It can also be understood that, since the teeth of the first internal gear 62 are cut on an internal surface of a cylinder, part of the first spur gear 80 needs to be received in the first accommodating space 63 and rotatably connected with the first internal gear 62, and thus a gear pair is formed. The rest of the first spur gear 80 is disposed outside the first accommodating space 63. The second spur gear 83 can be understood in the same way. The second spur gear 83 includes the third sub-spur gear 84 received in the second accommodating space 73 and the fourth sub-spur gear 85 disposed outside the second accommodating space 73. It can also be understood that, since the teeth of the second internal gear 72 are cut on an internal surface of a cylinder, part of the second spur gear 83 needs to be received in the second accommodating space 73 and rotatably connected with the second internal gear 72, and thus a gear pair is formed. The rest of the second spur gear 83 is disposed outside the second accommodating space 73 and is rotatably connected with the rest of the first spur gear 80 which is disposed outside the first accommodating space 63. That is, the fourth sub-spur gear 85 and the second sub-spur gear 82 are rotatably connected with each other to form a gear pair.

To sum up, in the synchronization mechanism 50 provided in the disclosure, by using two internal gears and two spur gears, a total of four gears cooperate with one another to form three gear pairs. It can also be understood that, the first internal gear 62 and the first sub-spur gear 81 cooperate with each other to form a first gear pair, the second sub-spur gear 82 and the fourth sub-spur gear 85 cooperate with each other to form a second gear pair, and the third sub-spur gear 84 and the second internal gear 72 cooperate with each other to form a third gear pair. The first sub-rotating member 21 in rotation drives the first internal gear 62 to rotate, the first internal gear 62 rotates synchronously with the first sub-spur gear 81, the first sub-spur gear 81 rotates synchronously with the second sub-spur gear 82, the second sub-spur gear 82 rotates synchronously with the fourth sub-spur gear 85, the fourth sub-spur gear 85 rotates synchronously with the third sub-spur gear 84, and the third sub-spur gear 84 rotates synchronously with the second internal gear 72. Since the second internal gear 72 is connected with the second sub-rotating member 22, synchronous rotation of the first sub-rotating member 21 and the second sub-rotating member 22 can be eventually realized. The synchronization mechanism 50 provided in the disclosure has a simple structure, and can realize the synchronous rotation of the first sub-rotating member 21 and the second sub-rotating member 22 by using three gear pairs. The number of gear pairs is reduced, which can reduce an accumulated backlash, improve synchronization effects of the synchronization mechanism 50, and at the same time ensure structural precision of the synchronization mechanism.

Figure 18:
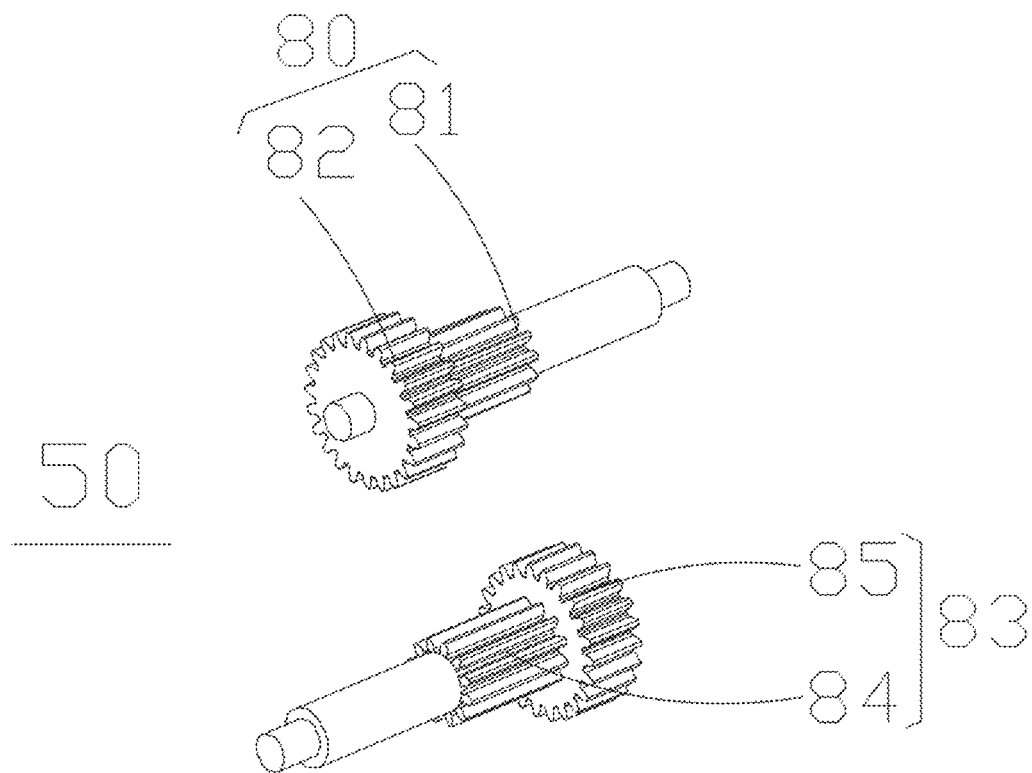
FIG. 18 is a schematic structural view of a first spur gear and a second spur gear in an implementation of the disclosure.

Referring to FIG. 18, which is a schematic structural view of a first spur gear and a second spur gear in an implementation of the disclosure. In this implementation, the second sub-spur gear 82 has a diameter larger than the first sub-spur gear 81, the fourth sub-spur gear 85 has a diameter larger than the third sub-spur gear 84.

When the synchronization mechanism 50 is in motion, that is, when the first internal gear 62 and the second internal gear 72 rotate synchronously, a slight distance deviation may occur between the first spur gear 80 and the second spur gear 83. For example, when each of the first internal gear 62 and the second internal gear 72 rotates by 90°, if the second sub-spur gear 82 has a diameter equal to the first sub-spur gear 81 and the fourth sub-spur gear 85 has a diameter equal to the third sub-spur gear 84, a certain gap may exist between the second sub-spur gear 82 and the fourth sub-spur gear 85, resulting in incomplete meshing. Hence, in the disclosure, the second sub-spur gear 82 has a diameter larger than the first sub-spur gear 81, the fourth sub-spur gear 85 has a diameter larger than the third sub-spur gear 84, such that the second sub-spur gear 82 and the fourth sub-spur gear 85 can fully mesh with each other no matter how much degrees the first internal gear 62 and the second internal gear 72 rotate, which improves the synchronization effects of the synchronization mechanism 50.

Figure 19:
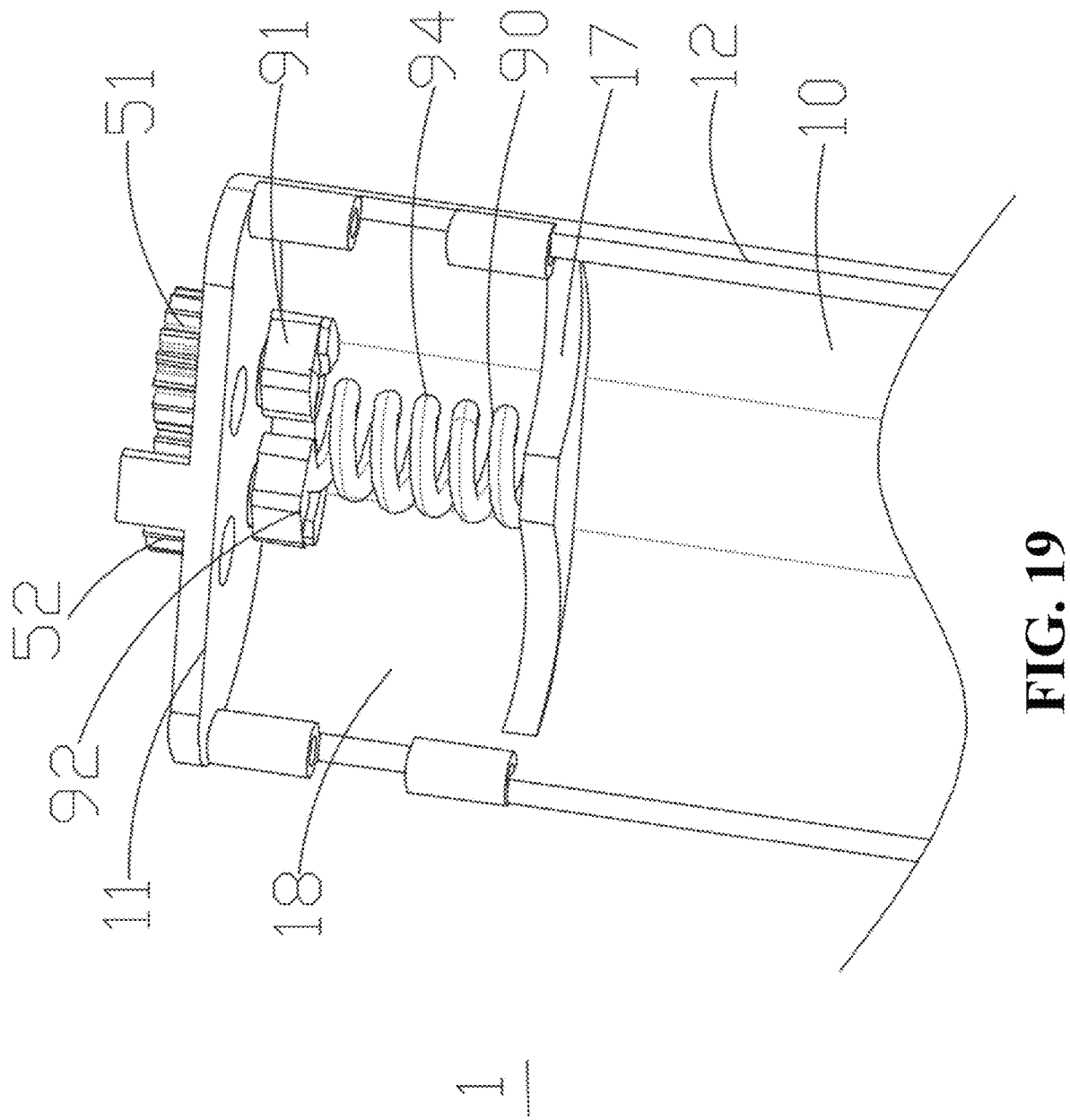
FIG. 19 is a partial schematic perspective structural view of an electronic assembly in another implementation of the disclosure.

Referring to FIG. 19, which is a partial schematic perspective structural view of an electronic assembly in another implementation of the disclosure. In this implementation, the first shaft case 10 further has a baffle plate 17. The baffle plate 17, the first sidewall 11, and the second sidewalls 12 arranged oppositely define a third receiving space 18. The electronic assembly 1 further includes a damping mechanism 90 at least partially received in the third receiving space 18. The damping mechanism 90 includes an elastic member 94, a first limiting portion 91, and a second limiting portion 92. The first limiting portion 91 has one end extended through the first sidewall 11 and connected with the first gear 51 and the other end abutted against one end of the elastic member 94. The second limiting portion 92 has one end extended through the first sidewall 11 and connect with the second gear 52 and the other end abutted against the end of the elastic member 94. The elastic member 94 has the other end connected with the baffle plate 17 and the elastic member 94 is in a compressed state.

In the disclosure, the baffle plate 17 can be further provided, such that the baffle plate 17, the first sidewall 11, and the second sidewall 12 can cooperate with one another to define a third receiving space 18. The damping mechanism 90 is further received in the third receiving space 18. In an implementation, the damping mechanism 90 is used to prevent the electronic assembly 1 from being arbitrarily bent. It can also be understood that the damping mechanism 90 is used to prevent the electronic assembly 1 from being bent when a small external force is applied. Several implementations are provided in the disclosure. In an implementation, the first limiting portion 91 is connected with the first gear 51, so that when the first gear 51 rotates, the first limiting portion 91 is driven to rotate together. The second limiting portion 92 can be understood in the same way. The elastic member 94 abuts against the first limiting portion 91 and the second limiting portion 92 at one end and is connected with the baffle plate 17 at the other end, and the elastic member 94 remains in a compressed state. That is, regardless of whether the electronic assembly 1 is in an unfolded state or a folded state, the elastic member 94 remains in a compressed state. Here, the elastic member 94 applies a restoring force to the first limiting portion 91 and the second limiting portion 92, and a direction of the restoring force is perpendicular to the first sidewall 11. When the electronic component 1 is subjected to a relatively small external force, the external force can be counteracted by the restoring force, so that the electronic component 1 will not be folded/unfolded. Only when a force applied to the housing 3 is greater than a certain value, the restoring force will be counteracted, so that the electronic assembly 1 starts to fold/unfolded.

Figure 20:
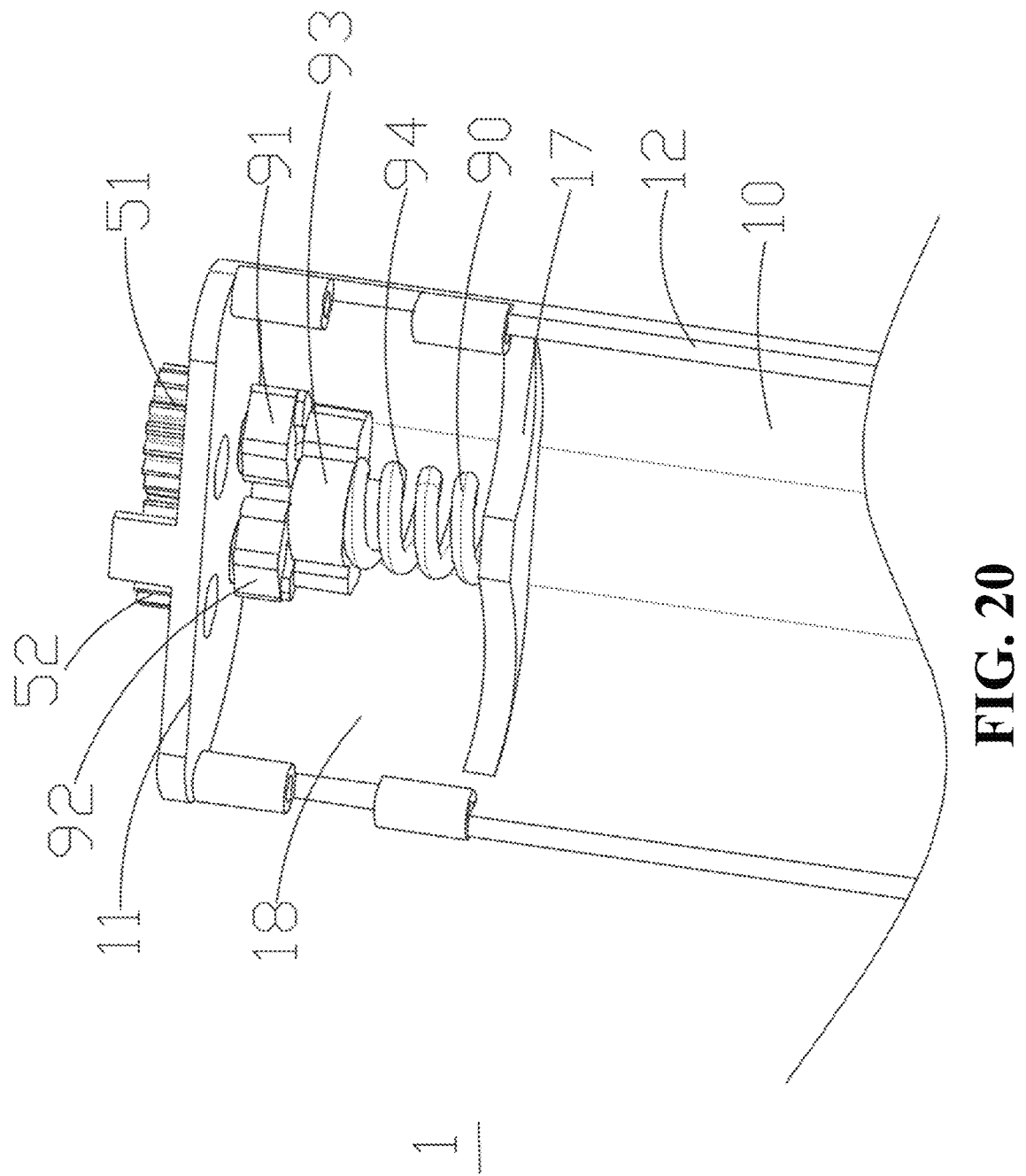
FIG. 20 is a partial schematic perspective structural view of an electronic assembly in another implementation of the disclosure.

Referring to FIG. 20, which is a partial schematic perspective structural view of an electronic assembly in another implementation of the disclosure. In this implementation, the damping mechanism 90 further includes a third limiting portion 93. The third limiting portion 93 has one end connected with the elastic member 94 and the other end abutted against the first limiting portion 91 and the second limiting portion 92.

In another implementation of the disclosure, the third limiting portion 93 can be further disposed between the elastic member 94 and the first/second limiting portion 91/92. The third limiting portion 93 is connected with the elastic member 94 at one end of the third limiting portion 93 and abutted against the first limiting portion 91 and the second limiting portion 92 at the other end of the third limiting portion 93. Hence, the restoring force is transferred to the first limiting portion 91 and the second limiting portion 92 through the third limiting portion 93, and structural stability of the damping mechanism 90 is improved by abutting the third limiting portion 93 against the first limiting portion 91 and the second limiting portion 92.

Figure 21:
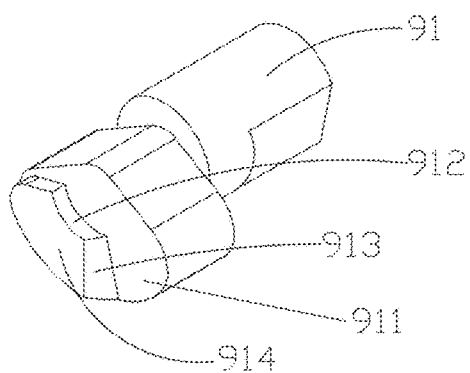
FIG. 21 is a schematic perspective structural view of a first limiting portion and a third limiting portion in an implementation of the disclosure.
Figure 21:
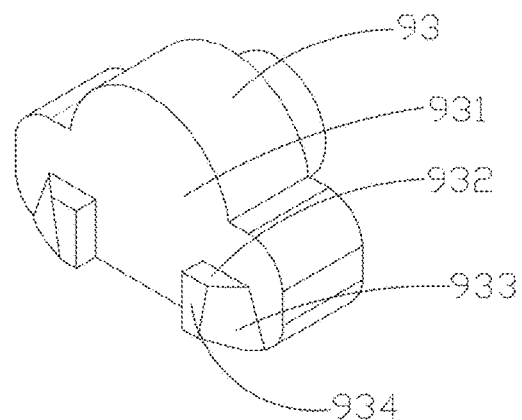
Figure 22:
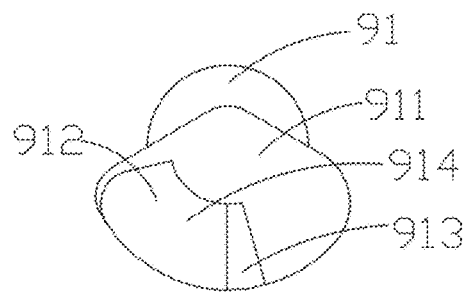
FIG. 22 is a front view of a first limiting portion and a third limiting portion in an implementation of the disclosure.
Figure 22:
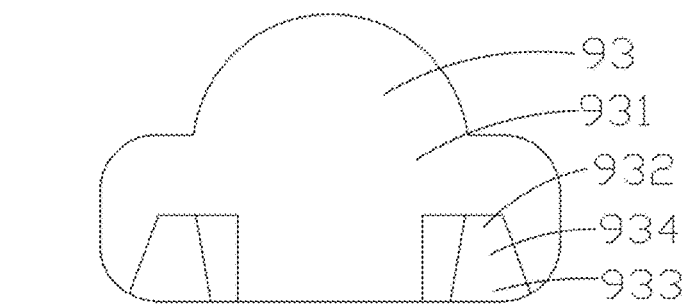

Referring to FIG. 21 and FIG. 22, FIG. 21 is a schematic perspective structural view of a first limiting portion and a second limiting portion in an implementation of the disclosure, and FIG. 22 is a front view of a first limiting portion and a third limiting portion in another implementation of the disclosure. In this implementation, a side surface of the first limiting portion 91 close to the third limiting portion 93 is a first flat surface 911, and a side surface of the third limiting portion 93 close to the first limiting portion 91 is a second flat surface 931. The first limiting portion 91 has a first protruding portion 912 protruded from part of the first flat surface 911. The first protruding portion 912 has a first inclined surface 913 connected with the first flat surface 911. The third limiting portion 93 has a second protruding portion 932 protruded from part of the second flat surface 931. The second protruding portion 932 has a second inclined surface 933 connected with the second flat surface 931. When the electronic assembly 1 is in an unfolded state, the first flat surface 911 abuts against the second flat surface 931, and the first inclined surface 913 abuts against the second inclined surface 933. When the electronic assembly 1 rotates, the first flat surface 911 is spaced apart from the second flat surface 931 and the first inclined surface 913 abuts against the second inclined surface 933. In an implementation, the first flat surface 911 and the second flat surface 931 are parallel to first sidewall 11. Alternatively, it can also be understood that the first flat surface 911 and the second flat surface 931 are parallel to a folding/unfolding direction of the electronic assembly 1.

In an implementation of the disclosure, the first limiting portion 91 can also has a first protruding portion 912, and the first protruding portion 912 has a first inclined surface 913. The third limiting portion 93 has the second protruding portion 932, and the second protruding portion 932 has a second inclined surface 933. In this case, when the electronic assembly 1 is in the unfolded state, the first flat surface 911 abuts against the second flat surface 931, the first inclined surface 913 abuts against the second inclined surface 933, and the restoring force of the elastic member 94 can be transferred to the first flat surface 911 of the first limiting portion 91 through the second flat surface 931 of the third limiting portion 93, so that the electronic assembly 1 can be avoided from being rotated when subjected to a small external force. When the electronic assembly 1 starts to fold/unfold, the housing 3 drives the first sub-rotating member 21 to rotate, the first sub-rotating member 21 drives the first gear 51 to rotate, and the first gear 51 drives the first limiting portion 91 to rotate, and then, the first flat surface 911 will be separated from the second flat surface 931, and only the first inclined surface 913 abuts against the second inclined surface 933. In an implementation, the first limiting portion 91 abuts against the first inclined surface 913 of the second inclined surface 933, or other parts of the first limiting portion 91 abut against the second inclined surface 933, as such, the restoring force transferred by the second inclined surface 933 on the first limiting portion 91 can be decomposed into components which include a rotating force, which can make the electronic assembly 1 return to the unfolded state by itself when the electronic assembly 1 is free of an external force. For example, when a user applies an external force to the electronic assembly 1 and folds the electronic assembly 1 by 30°, the electronic assembly 1 can automatically return to the unfolded state upon removing the external force. In addition, when the first limiting portion 91 is rotated, due to an interaction between the second inclined surface 933 and the first protruding portion 912, that is, the first inclined surface 913 abuts against the second inclined surface 933, the third limiting portion 93 can be moved toward the baffle plate 17, which further compresses the elastic member 94 and then improves the restoring force of the elastic member 94.

Referring to FIG. 21 and FIG. 22, in this implementation, the first protruding portion 912 further has a third flat surface 914 connected with the first inclined surface 913. The third flat surface 914 is parallel to the first flat surface 911. The second protruding portion 932 further has a fourth flat surface 934 connected with the second inclined surface 933. The fourth flat surface 934 is parallel to the second flat surface 931. When the electronic assembly 1 is folded to a predetermined angle, the third flat surface 914 abuts against the fourth flat surface 934. In an implementation, the third flat surface 914 and the fourth flat surface 934 are parallel to the first sidewall 11. Alternatively, it can also be understood that the third flat surface 914 and the fourth flat surface 934 are parallel to the folding/unfolding direction of the electronic assembly 1.

In this implementation, the first protruding portion 912 further has the third flat surface 914 connected with the first inclined surface 913, and the second protruding portion 932 further has the fourth flat surface 934 connected with the second inclined surface 933. As such, when the electronic assembly 1 is folded by a predetermined angle, the third flat surface 914 abuts against the fourth flat surface 934. Here, the restoring force is transferred to the third flat surface 914 through the fourth flat surface 934, so that the electronic assembly 1 can be prevented from folding/unfolding under a small external force. For example, when the user applies an external force to the electronic assembly 1 and folds the electronic assembly 1 by 60°, firstly, the electronic assembly 1 may not automatically recover to the unfolded state upon removing the external force, and secondly, the electronic assembly 1 is further prevented from being folding/unfolding under a small external force.

As an example, in the above-mentioned implementations, only the first limiting portion 91 and the third limiting portion 93 are described in structures. The second limiting portion 92 can also have the same structure as the first limiting portion 91, that is, the second limiting portion 92 may also have a protruding portion on a flat surface of the second limiting portion 92, and the protruding portion also has an inclined surface and a flat surface. Here, the third limiting portion 93 may also have a protruding portion, and the protruding portion also has an inclined surface and a flat surface. Further, in an implementation, the first limiting portion 91, the second limiting portion 92, and the third limiting portion 93 may be arranged in an axis-symmetric manner, which can further improve the damping and limiting effects of the electronic assembly 1.

In an implementation of the disclosure, when the electronic assembly is unfold, that is, the flexible screen 5 is in a flatten state, the first inclined surface 913 will abut against the second inclined surface 933, which can prevent the first limiting portion 91 and the second limiting portion 92 from reversely rotating automatically, such that the flexible screen 5 can maintain a flatten display surface.

In addition to the electronic assembly 1 described above, an electronic device 4 is further provided in implementations of the disclosure. Both the electronic device 4 and the electronic assembly 1 provided in the disclosure can realize inventiveness of the disclosure. As an example, the electronic device 4 described hereinafter can include the electronic assembly 1 provided above.

Figure 23:
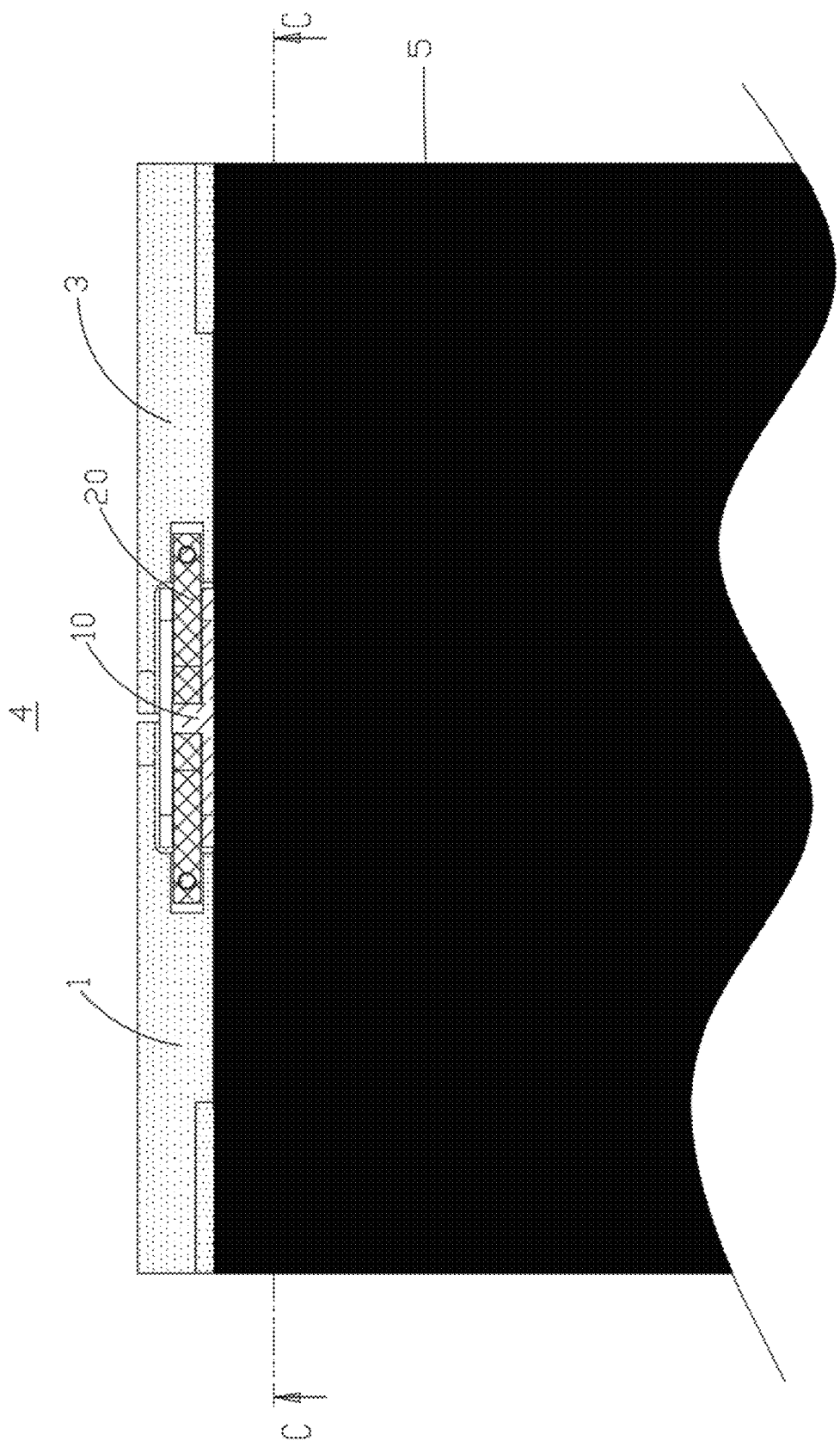
FIG. 23 is a partial top view of an electronic device in an unfolded state in an implementation of the disclosure.
Figure 24:
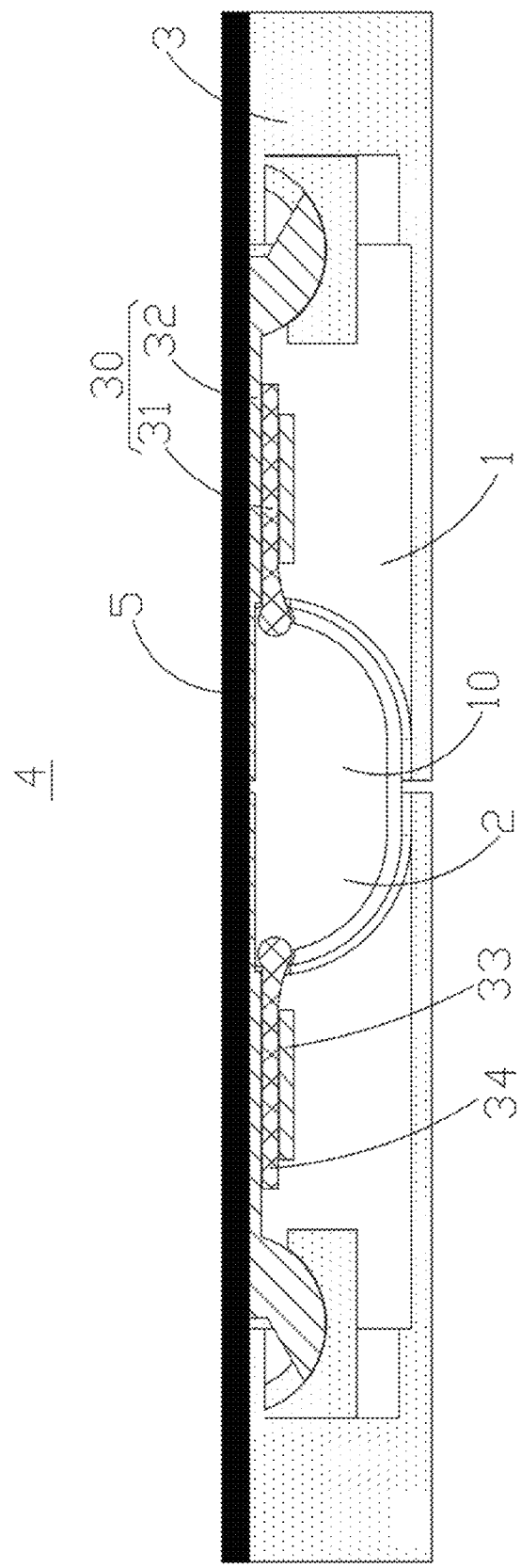
FIG. 24 is a cross-sectional view of FIG. 23 taken along line C-C.
Figure 25:
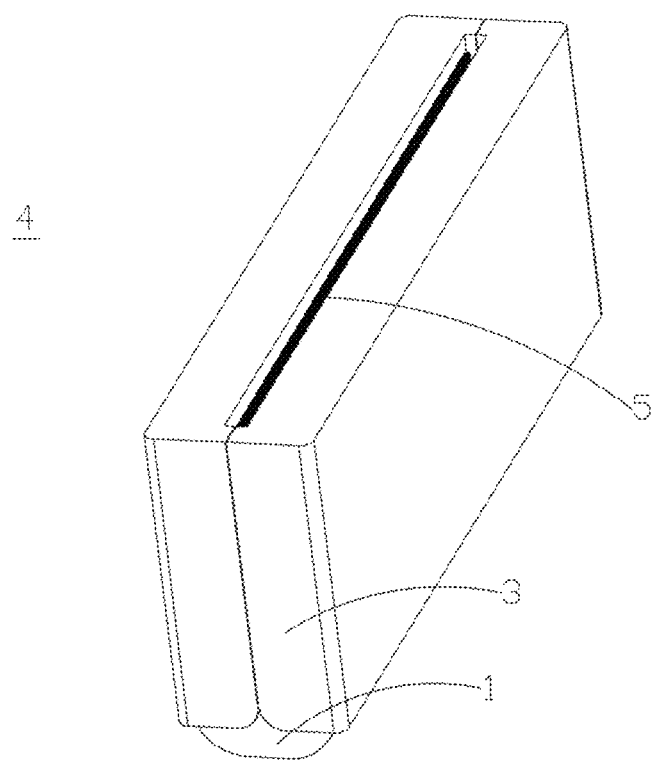
FIG. 25 is a schematic perspective structural view of an electronic device in a folded state in an implementation of the disclosure.
Figure 26:
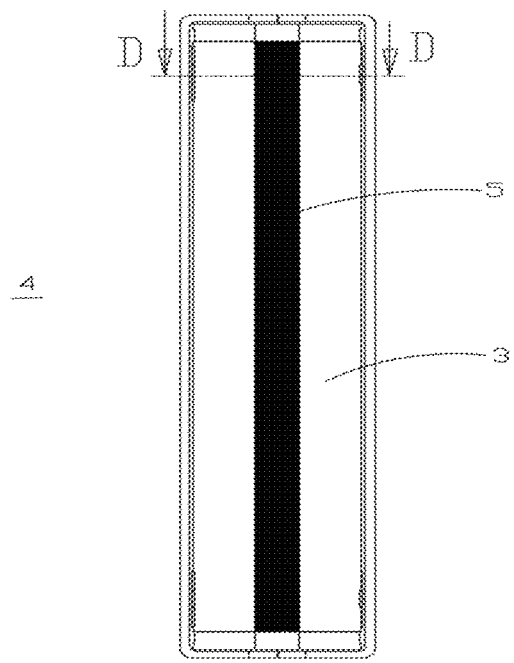
FIG. 26 is a top view of the electronic device illustrated in FIG. 25.
Figure 27:
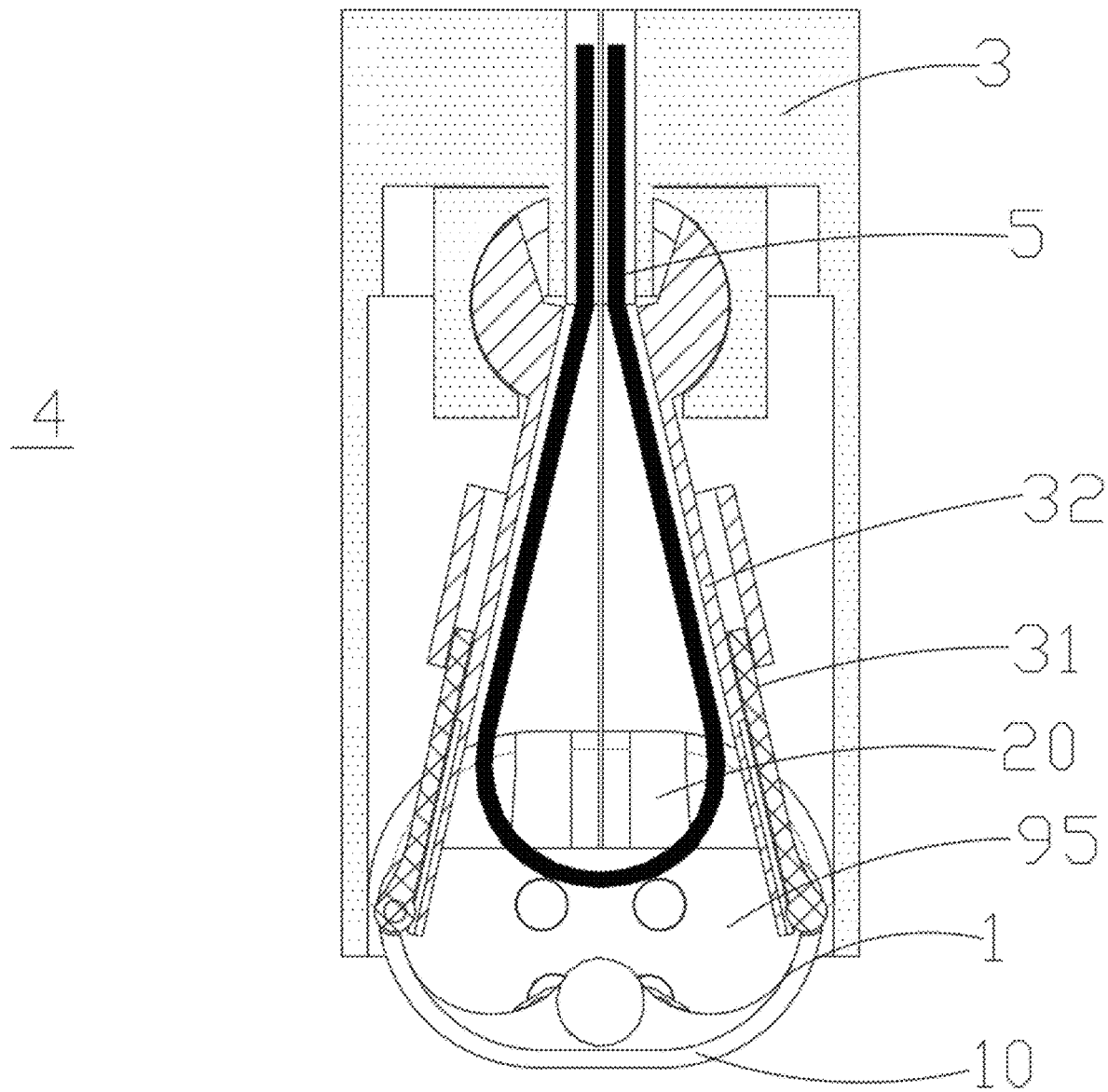
FIG. 27 is a cross-sectional view of FIG. 26 taken along line D-D.

Referring to FIGS. 23-27, FIG. 23 is a partial top view of an electronic device in an unfolded state in an implementation of the disclosure, FIG. 24 is a cross-sectional view of FIG. 23 taken along line C-C, FIG. 25 is a schematic perspective structural view of an electronic device in a folded state in an implementation of the disclosure, FIG. 26 is a top view of the electronic device illustrated in FIG. 25, and FIG. 27 is a cross-sectional view of FIG. 26 taken along line D-D. An electronic device 4 provided in this implementation includes a flexible screen 5 and the electronic assembly provided in the foregoing implementations of the disclosure. The flexible screen 5 is mounted on the movable plate 32 of the electronic assembly 1.

The electronic device 4 provided in the disclosure includes, but is not limited to, a cell phone, a tablet, a laptop, a personal computer (PC), a personal digital assistants (PDA), a portable media player (PMP), a navigation device, a wearable device, a smart bracelet, a pedometer, and other mobile terminals, as well as a fixed terminal such as a digital television (TV) and a desktop computer.

In the electronic device 4 provided in the disclosure, the flexible screen 5 can be mounted on the movable plates 32 to allow the flexible screen 5 to be bent inwardly, that is, when the electronic device 4 is bent, the flexible screen 5 is not exposed, instead, the flexible screen 5 is protected by the housings 3. It is clear from the above that when the housings 3 are bent under an external force, the housings 3 can drive the movable plates 32 to bend together, and the movable plates 32 in turn drive the flexible screen 5 on the movable plates 32 to bend. In the electronic device 4 provided in the disclosure, with aid of the electronic assembly 1 provided in above implementation of the disclosure, the electronic device 4 can be bent, and the drop-shaped screen is also achieved, which reduces an accumulated amount of the displacements after falling, improves the quality of the shaft assembly 2, and ensures precision of the electronic device 4.

Referring to FIG. 27, in this implementation, the first shaft case 10 defines an avoidance groove 95 on one side of the first shaft case 10 close to the flexible screen 5. The avoidance groove 95 is configured to receive part of the flexible screen 5 when the electronic device 4 is bent. During bending of the electronic device 4, the flexible screen 5 will have a certain displacement in a direction towards the first shaft case 10 at a position where the flexible screen 5 is bent. Thus, in the disclosure, the first shaft case 10 can define the avoidance groove 95 on one side of the first shaft case 10 close to the flexible screen 5, so that when the flexible screen 5 is bent, the avoidance groove 95 may accommodate part of the flexible screen 5 that is displaced in the direction towards the first shaft case 10, which can prevent the flexible screen 5 during bending from collision with the first shaft case 10 and protect the flexible screen 5.

In the implementations of the disclosure, when folding the electronic device 4, the two movable plates 32 can rotate relative to the housings 3 and slide relative to the first shaft case 10, which allows the two movable plates 32 to define a substantially triangular space therebetween, and the flexible screen 5 in the drop-shape after being bent can be received in the substantially triangular space, thereby realizing the drop-shaped screen.

The implementations of the disclosure are described in detail above, specific examples are used herein to describe the principle and implementation manners of the disclosure. The description of the above implementations is merely used to help understand the method and the core idea of the disclosure. Meanwhile, those skilled in the art may make modifications to the implementation manners and the application scope according to the idea of the disclosure. In summary, the contents of the specification should not be construed as limiting the disclosure.

What is claimed is:

1. An electronic device, comprising:
a shaft assembly and housings arranged oppositely;
wherein the shaft assembly comprises:
a first shaft case, the housings being at least partially disposed at two opposite sides of the first shaft case;
first rotating members at least partially disposed at the two opposite sides of the first shaft case, each of the first rotating members having one end rotatably connected with the first shaft case and another end movably connected with the housings; and
rotating units at least partially disposed at the two opposite sides of the first shaft case, each of the rotating units comprising a second rotating member and a movable plate, the second rotating member having one end rotatably connected with the first shaft case and another end connected with the movable plate, and the movable plate having one end rotatably connected to the housings, wherein different portions of a flexible screen of the electronic device are respectively supported by the movable plate and the housings, and a surface of the movable plate supporting the flexible screen and a surface of the housings supporting the flexible screen are coplanar; and
a rotation axis around which the first rotating member is rotatable relative to the first shaft case is parallel to a rotation axis around which the second rotating member is rotatable relative to the first shaft case;
wherein the movable plate has a first rotating portion at one end thereof, the housing has a second rotating portion, the first rotating portion and the second rotating portion cooperate with each other to allow the movable plate to be rotatably connected with the housing at one end of the movable plate;
wherein the first shaft case comprises a baffle plate, two first sidewalls arranged oppositely and two second sidewalls arranged oppositely, the baffle plate, the first sidewall, and the second sidewalls arranged oppositely define a third receiving space, wherein the electronic assembly further comprises a damping mechanism at least partially received in the third receiving space;
wherein the damping mechanism comprises an elastic member, a first limiting portion, a second limiting portion, and a third limiting portion, the third limiting portion has one end connected with the elastic member and the other end abutted against the first limiting portion and the second limiting portion, wherein the first limiting portion has a first protruding portion protruded from part of a first flat surface of the first limiting portion, the first protruding portion has a first inclined surface connected with the first flat surface, the third limiting portion has a second protruding portion protruded from part of a second flat surface of the third limiting portion, the second protruding portion has a second inclined surface connected with the second flat surface, when the electronic assembly is in unfolded state, the first flat surface abuts against the second flat surface, and the first inclined surface abuts against the second inclined surface, when the electronic assembly rotates, the first inclined surface abuts against the second inclined surface.

2. The electronic device of claim 1, wherein the movable plate has a first sliding portion, the second rotating member has a second sliding portion, the first sliding portion and the second sliding portion cooperate with each other to allow the movable plate to slide relative to the second rotating member.

3. The electronic device of claim 1, wherein:
the first rotating portion is a guide rail, and the second rotating portion is a sliding groove; or
the first rotating portion is a sliding groove, and the second rotating portion is a guide rail.

4. The electronic device of claim 1, wherein the first rotating portion defines a rotating hole, the second rotating portion has a rotating member, and the first rotating portion is sleeved with the rotating member through the rotating hole to allow the movable plate to be rotatably connected with the housing at one end of the movable plate.

5. The electronic device of claim 1, further comprising second shaft cases connected with the first shaft case, each of the first rotating members being disposed between the first shaft case and one second shaft case.

6. The electronic device of claim 5, wherein:
the first shaft case is provided with a first positioning portion, the second shaft case is further provided with a second positioning portion, and the first position portion and the second positioning portion cooperate with each other to allow the second shaft case to be connected with the first shaft case; and
the first rotating member is sleeved on the first positioning portion or the second positioning portion.

7. The electronic device of claim 1, wherein:
the first shaft case has a third rotating portion, the second rotating member has a fourth rotating portion; and
the third rotating portion and the fourth rotating portion cooperate with each other to allow the second rotating member to be rotatably connected with the first shaft case.

8. The electronic device of claim 1, further comprising a synchronization mechanism, wherein the first rotating members at least partially disposed at the two opposite sides of the first shaft case are a first sub-rotating member and a second sub-rotating member, and the synchronization mechanism is connected with the first sub-rotating member and the second sub-rotating member to allow the first sub-rotating member and the second sub-rotating member to synchronously rotate.

9. The electronic device of claim 8, the synchronization mechanism comprises a first gear and a second gear, the first sub-rotating member is rotatably connected with the first gear, the first gear is rotatably connected with the second gear, and the second gear is rotatably connected with the second sub-rotating member.

10. An electronic device, comprising:
a shaft assembly and housings arranged oppositely;
wherein the shaft assembly comprises:
a first shaft case, the housings being at least partially disposed at two opposite sides of the first shaft case;
first rotating members at least partially disposed at the two opposite sides of the first shaft case, each of the first rotating members having one end rotatably connected with the first shaft case and another end movably connected with the housings; and
rotating units at least partially disposed at the two opposite sides of the first shaft case, each of the rotating units comprising a second rotating member and a movable plate, the second rotating member having one end rotatably connected with the first shaft case and another end connected with the movable plate, and the movable plate having one end connected to the housings, wherein different portions of a flexible screen of the electronic device are respectively supported by the movable plate and the housings, and a surface of the movable plate supporting the flexible screen and a surface of the housings supporting the flexible screen are coplanar; and
the movable plate is provided with a first rotating portion at one end thereof, the housing is provided with a second rotating portion, the first rotating portion and the second rotating portion cooperate with each other to allow the movable plate to be rotatably connected with the housing at one end of the movable plate;
wherein the first shaft case comprises a baffle plate, two first sidewalls arranged oppositely and two second sidewalls arranged oppositely, the baffle plate, the first sidewall, and the second sidewalls arranged oppositely define a third receiving space, wherein the electronic assembly further comprises a damping mechanism at least partially received in the third receiving space;
wherein the damping mechanism comprises an elastic member, a first limiting portion, a second limiting portion, and a third limiting portion, the third limiting portion has one end connected with the elastic member and the other end abutted against the first limiting portion and the second limiting portion, wherein the first limiting portion has a first protruding portion protruded from part of a first flat surface of the first limiting portion, the first protruding portion has a first inclined surface connected with the first flat surface, the third limiting portion has a second protruding portion protruded from part of a second flat surface of the third limiting portion, the second protruding portion has a second inclined surface connected with the second flat surface, when the electronic assembly is in unfolded state, the first flat surface abuts against the second flat surface, and the first inclined surface abuts against the second inclined surface, when the electronic assembly rotates, the first inclined surface abuts against the second inclined surface.

11. The electronic device of claim 10, wherein:
the first rotating portion is a guide rail, and the second rotating portion is a sliding groove; or
the first rotating portion is a sliding groove, and the second rotating portion is a guide rail.

12. The electronic device of claim 10, wherein the first rotating portion defines a rotating hole, the second rotating portion has a rotating member, and the first rotating portion is sleeved with the rotating member through the rotating hole to allow the movable plate to be rotatably connected with the housing.

13. The electronic device of claim 10, wherein a rotation axis around which the first rotating member is rotatable relative to the first shaft case is parallel to a rotation axis around which the second rotating member is rotatable relative to the first shaft case.

14. The electronic device of claim 10, wherein the movable plate is provided with a first sliding portion, the second rotating member is provided with a second sliding portion, the first sliding portion and the second sliding portion cooperate with each other to allow the movable plate to slide relative to the second rotating member.

15. The electronic device of claim 10, further comprising second shaft cases connected with the first shaft case, each of the first rotating members being disposed between the first shaft case and one second shaft case.

16. The electronic device of claim 15, wherein:
the first shaft case is provided with a first positioning portion, the second shaft case is further provided with a second positioning portion, and the first position portion and the second positioning portion cooperate with each other to allow the second shaft case to be connected with the first shaft case; and
the first rotating member is sleeved on the first positioning portion or the second positioning portion.

17. The electronic device of claim 10, wherein:
the first shaft case is provided with a third rotating portion, the second rotating member is provided with a fourth rotating portion; and
the third rotating portion and the fourth rotating portion cooperate with each other to allow the second rotating member to be rotatably connected with the first shaft case.

18. The electronic device of claim 10, further comprising a synchronization mechanism, wherein the first rotating members at least partially disposed at the two opposite sides of the first shaft case are a first sub-rotating member and a second sub-rotating member, and the synchronization mechanism is connected with the first sub-rotating member and the second sub-rotating member to allow the first sub-rotating member and the second sub-rotating member to synchronously rotate.

19. The electronic device of claim 18, the synchronization mechanism comprises a first gear and a second gear, the first sub-rotating member is rotatably connected with the first gear, the first gear is rotatably connected with the second gear, and the second gear is rotatably connected with the second sub-rotating member.

* * * * *